(12) United States Patent
Nilsson

(10) Patent No.: US 10,840,949 B2
(45) Date of Patent: Nov. 17, 2020

(54) DEVICE AND ASSOCIATED METHODOLOGY FOR ENCODING AND DECODING OF DATA FOR AN ERASURE CODE

(71) Applicant: ZEBWARE AB, Stockholm (SE)

(72) Inventor: Thomas Nilsson, Meilen (CH)

(73) Assignee: ZEBWARE AB, Stockholm (SE)

(*) Notice: Subject to any disclaimer, the term of this patent is extended or adjusted under 35 U.S.C. 154(b) by 78 days.

(21) Appl. No.: 16/251,746

(22) Filed: Jan. 18, 2019

(65) Prior Publication Data

US 2019/0158124 A1     May 23, 2019

Related U.S. Application Data

(62) Division of application No. 15/494,054, filed on Apr. 21, 2017, now Pat. No. 10,523,244.

(Continued)

(51) Int. Cl.
*H03M 13/00*     (2006.01)
*H03M 13/29*     (2006.01)
(Continued)

(52) U.S. Cl.
CPC ....... *H03M 13/2942* (2013.01); *H03M 13/27* (2013.01); *H03M 13/293* (2013.01);
(Continued)

(58) Field of Classification Search
CPC ............ H03M 13/2942; H03M 13/27; H03M 13/2906; H03M 13/293; H03M 13/3761
See application file for complete search history.

(56) References Cited

U.S. PATENT DOCUMENTS

| 6,959,274 B1* | 10/2005 | Gao ......................... G10L 19/20 704/219 |
| 8,042,029 B2* | 10/2011 | Alrod ................ H03M 13/3707 714/791 |

(Continued)

FOREIGN PATENT DOCUMENTS

| EP | 2 863 566 A1 | 4/2015 |
| WO | WO 2015/055450 A1 | 4/2015 |

(Continued)

OTHER PUBLICATIONS

International Preliminary Report on Patentability and Written Opinion dated Feb. 12, 2019 in PCT/IB2017/001110.

(Continued)

*Primary Examiner* — Esaw T Abraham
(74) *Attorney, Agent, or Firm* — Oblon, McClelland, Maier & Neustadt, L.L.P.

(57) ABSTRACT

A method of redundantly encoding data includes formatting the data into columns and rows, and generating first and second sets of projections of the data using an encoding transform. For each set of projections generated, an encoding parameter of the encoding transform is set to a different value. The first and second sets of projections are stored as the encoded data. A decoding method reads settings including an indication of a number of data fragments. The number of data fragments is compared to a number of projections in a first set of projections of the encoded data in order to determine whether to use a first or a second decoding mode. The encoded data is then decoded according to the selected decoding mode and the result is outputted.

10 Claims, 20 Drawing Sheets

Related U.S. Application Data

(60) Provisional application No. 62/373,532, filed on Aug. 11, 2016.

(51) Int. Cl.
  *H03M 13/27* (2006.01)
  *H03M 13/37* (2006.01)
  *H03M 13/09* (2006.01)

(52) U.S. Cl.
  CPC ... *H03M 13/2906* (2013.01); *H03M 13/3761* (2013.01); *H03M 13/611* (2013.01); *H03M 13/09* (2013.01)

(56) References Cited

U.S. PATENT DOCUMENTS

| | | | | |
|---|---|---|---|---|
| 8,509,551 | B2* | 8/2013 | Moriya | H04N 19/139 375/240.13 |
| 9,912,995 | B2* | 3/2018 | Oh | H04N 21/8126 |
| 10,382,765 | B2* | 8/2019 | Francois | H04N 19/176 |
| 10,666,287 | B2* | 5/2020 | Ma | H03M 7/3082 |
| 2008/0165861 | A1 | 7/2008 | Wen | H04N 19/132 375/240.26 |
| 2009/0085779 | A1* | 4/2009 | Tsao | H03M 5/14 341/50 |
| 2009/0268755 | A1* | 10/2009 | Inoishi | H04L 65/605 370/466 |
| 2012/0051436 | A1* | 3/2012 | Chen | H04N 21/23406 375/240.25 |
| 2013/0100245 | A1* | 4/2013 | Lee | H04N 19/597 348/43 |
| 2016/0254826 | A1 | 9/2016 | David et al. | |

FOREIGN PATENT DOCUMENTS

| | | |
|---|---|---|
| WO | WO 2015/145078 A2 | 10/2015 |
| WO | WO 2017/023199 A1 | 2/2017 |

OTHER PUBLICATIONS

Office Action dated Mar. 19, 2019 in European Patent Application No. 17781532.1.

Written Opinion of the International Searching Authority dated Dec. 4, 2014 in International Patent Application No. PCT/EP2014/071310.

Written Opinion of the International Searching Authority dated Mar. 22, 2016 in International Patent Application No. PCT/FR2015/050771.

Serfozo P. et al., "Performance requirements of the Mojette Transform for internet distributed databases and image processing" Optimization of Electrical and Electronic Equipment, May 22, 2008, XP 031341303, 6 pages.

N. Normand, et al., "Controlled Redundancy for Image Coding and High-speed Transmission", Visual Communications and Image Processing, Feb. 27, 1996, XP002721553, 12 pages.

Jozsef Vasarhelyi, et al., "Analysis of Mojette Transform Implementation on Reconfigurable Hardware", Dagstuhl Seminar Proceedings 06141, Apr. 2, 2006, XP55161918, 6 pages.

Nicolas Normand, et al., "A Geometry Driven Reconstruction Algorithm for the Majette Transform", HAL archives-ouvertes.fr, Mar. 27, 2008, 14 pages.

A Guide to Vectorization with Intel® C++ Compilers, Intel Corporation, 2010, 39 pages.

Pierre Verbert, et al., "Analysis of Mojette Transform Projections for an Efficient Coding", HAL archives-ouvertes.fr, Jan. 28, 2010, 5 pages.

Erasure Coding and Cache Tiering, ceph, Samuel Just, 2015, 68 pages.

Intel® Intelligent Storage Acceleration Library (Intel® ISA-L) Open Source Version, Intel, API Reference Manual—Version 2.8, Sep. 27, 2013, 25 pages.

International Search Report and Written Opinion dated Jan. 12, 2018 in PCT/IB2017/001110.

Dimitri Pertin, et al., "Performance evaluation of the Mojette erasure code for fault-tolerant distributed hot data storage", https://arxiv.org/pdf/1504.07038.pdf, XP055436711, 2015, 5 pages.

\* cited by examiner

Fig 3

| 1 | 2 | 3 | 4 | 5 | 6 | 7 | 8 | 9 | 10 | 11 | 12 | 13 | 14 | 15 | 16 |
|---|---|---|---|---|---|---|---|---|----|----|----|----|----|----|----|
| 17 | 18 | 19 | 20 | 21 | 22 | 23 | 24 | 25 | 26 | 27 | 28 | 29 | 30 | 31 | 32 |
| 33 | 34 | 35 | 36 | 37 | 38 | 39 | 40 | 41 | 42 | 43 | 44 | 45 | 46 | 47 | 48 |
| 49 | 50 | 51 | 52 | 53 | 54 | 55 | 56 | 57 | 58 | 59 | 60 | 61 | 62 | 63 | 64 |

Fig 6a

| 1 | 5 | 9 | 13 | 17 | 21 | 25 | 29 | 33 | 37 | 41 | 45 | 49 | 53 | 57 | 61 |
|---|---|---|----|----|----|----|----|----|----|----|----|----|----|----|----|
| 2 | 6 | 10 | 14 | 18 | 22 | 26 | 30 | 34 | 38 | 42 | 46 | 50 | 54 | 58 | 62 |
| 3 | 7 | 11 | 15 | 19 | 23 | 27 | 31 | 35 | 39 | 43 | 47 | 51 | 55 | 59 | 63 |
| 4 | 8 | 12 | 16 | 20 | 24 | 28 | 32 | 36 | 40 | 44 | 48 | 52 | 56 | 60 | 64 |

Fig 6b

| Bin | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| P(2,1) | | | 3 | 4 | 5 | 6 | 7 | 8 | 9 | 10 | 11 | 12 | 13 | 14 | 15 | 16 | | | | | | |
| | | | 17 | 18 | 19 | 20 | 21 | 22 | 23 | 24 | 25 | 26 | 27 | 28 | 29 | 30 | 31 | 32 | | | | |
| | | | | 33 | 34 | 35 | 36 | 37 | 38 | 39 | 40 | 41 | 42 | 43 | 44 | 45 | 46 | 47 | 48 | | |
| | | | | | | | 49 | 50 | 51 | 52 | 53 | 54 | 55 | 56 | 57 | 58 | 59 | 60 | 61 | 62 | 63 | 64 |
| Sum Bin | 1 | 2 | 20 | 22 | 57 | 60 | 112 | 116 | 120 | 124 | 128 | 132 | 136 | 140 | 144 | 148 | 135 | 138 | 108 | 110 | 63 | 64 |

DEVICE AND ASSOCIATED METHODOLOGY FOR ENCODING AND DECODING OF DATA FOR AN ERASURE CODE

CROSS-REFERENCE TO RELATED APPLICATIONS

The present application is a divisional of U.S. application Ser. No. 15/494,054, entitled DEVICE AND ASSOCIATED METHODOLOY FOR ENCODING AND DECODING OF DATA FOR AN ERASURE CODE and filed Apr. 21, 2017, which issued as U.S. Patent No. 10,523,244 on Dec. 31, 2019 and which claims priority to U.S. Provisional Application No. 62/373,532, entitled METHOD AND DEVICES FOR ENDCOIDNG AND DECONDING OF DATA and filed Aug. 11, 2016. The entire contents of both of which are incorporated herein by reference.

TECHNICAL FIELD

The present advancements generally relate to an erasure code design based on a Mojette Transform using a combination of systematic code and non-systematic code for data storage, and in particular for the use in high efficiency distributed data transfer over non perfect networks having a dual mode operation depending on the presence of erasure.

BACKGROUND

Data corruption in data storage environments can have many different causes, such as hardware, network, disks, environmental, radiation, electrical, software and more, all leading to a data error in client applications. In today's data environment where more and more focus is on distributed data and applications, the problem moves from more secure data centers, DCs, to small Internet of Things, IoT, devices and Internet. To mitigate problems with data errors, DCs replicate the data over several DC sites to have copies of the data available at all times. However, replicating copies of data creates time gaps between the data copies, multiplies the amount of data, and also creates a lot of extra work for the DCs to be able to maintain all the data.

The introduction of Forward Error Correction, FEC, codes greatly improved this situation in DCs for the handling of Redundant Array of Inexpensive Disks, RAID. However, the present Reed-Solomon FEC code and similar FEC codes are not well suited for distributed data storage handling of tomorrow's needs for widely distributed storage. Today the standard for storage is to use a systematic erasure code, where the systematic code refers to the case when input data is embedded in the encoded output, and on the other side a non-systematic code refers to the case where the output does not contain the input symbols. By nature the Mojette transformation is a non-systematic code and does not have an optimal performance during non-erasure operation modes and also does not fit directly into legacy data storage erasure code frameworks or erasure code-aware code frameworks designed to for systemic erasure code libraries.

The Mojette transform is by nature a non-systematic code and the parity chunks have a larger size $(1+\varepsilon)$ than a corresponding systematic chunk, where epsilon is $\varepsilon>0$ making the party chunks (m) containing more information than data chunks. This property of the m parity chunks can later be seen to be used on modern CPU's for the purpose of reducing the CPU cycles of the decoding process having aligned packages of the m parity projections with a $\varepsilon>>0$, as a basis to create an optimal performance.

As an example of systematic code, Reed-Solomon codes runs with optimal performance when no erasure is present when it is a systematic code but suffers severely during operation when there is a need for erasure to be present. This unpredictable performance of Reed-Solomon makes the use of erasure code mainly suitable for cold data storage and applications where performance is of less importance. There is therefore a need within the technology to provide alternative mechanisms related to the encoding and decoding of data in order to counter the known draw-backs. The present advancements aims to provide such mechanism to at least mitigate some of the drawbacks of the conventional encoding and decoding mechanisms.

SUMMARY

The present advancements provide mechanisms whereby encoding and decoding of data in the form of data blocks, files or other formats can be improved by dividing the decoding phase up into a minimum of two phases, the preamble phase and the stable phase, and then efficiently solve multiple pixels per iteration during the stable phase. The present advancements enable, in particular, for a more robust data storage since the encoding and decoding mechanisms disclosed herein enables a reconstruction or rebuilding of erroneously decoded data or erased data. The present advancements also provide for a computationally non-intensive correction since the correction of erroneously decoded data only utilizes arithmetic operations in the form of additions and subtractions. This reduces computational demands when correcting data that has, e.g., been stored in distributed data storage.

The present advancements describe creating a high performance, high availability, erasure code, referred to herein as OPTFEC, with built in dual mode operation, systematic and non-systematic, together with error detection and correction comprising a Mojette transform in combination with optimal performance operation during non-erasure operations. The present advancements also describe how to introduce the OPTFEC code for DC implementations as well as for widely distributed storage networks, such as IoT and Cloud Storage, and how an OPTFEC is included in the data transform.

According to an exemplary aspect of the present advancements, a method of redundantly encoding data includes receiving, by circuitry, data to be encoded, and formatting, by the circuitry, the data into rows and columns. The method also includes generating, by the circuitry, a first set of projections of the data based on an encoding transform using a first parameter value for an encoding parameter of the encoding transform, and generating, by the circuitry, a second set of projections of the data based on the encoding transform using a second parameter value for the encoding parameter that is different from the first parameter value. The first and second projections are then stored as the encoded data. According to another exemplary aspect of the present advancements, An encoding apparatus that redundantly encodes data includes a communication circuit configured to receive data to be encoded, and a processing circuit. The processing circuit formats the data into rows and columns, and generates a first set of projections based on an encoding transform using a first parameter value for an encoding parameter of the encoding transform. The processing circuit also generates a second set of projections based on the encoding transform using a second parameter value for the encoding parameter that is different from the first parameter value. The processing circuit then stores the first and second sets of projections in a memory as encoded data corresponding to the data received.

According to a further exemplary aspect of the present disclosure, a method of decoding encoded data includes reading, by circuitry and from a memory, settings for determining how to decode the encoded data, where the settings include at least a number of data fragments and a number of parity fragments needed for decoding of the data. The method also includes reading, by the circuitry, the encoded data, and determining, by the circuitry, whether a number of projections in a first set of projections of the encoded data is equal to the number of data fragments indicated in the settings. The method further includes selecting, by the circuitry, one of a first decoding mode and a second decoding mode to decode the encoded data based on whether the number of projections in the first set of projections equals the number of data fragments indicated in the settings, and decoding, by the circuitry, the encoded data with the selected one of the first and second decoding modes. The circuitry then outputs data generated by decoding the encoded data according to the method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is an example of Mojette transform encoding of a block of three rows with six pixels in each row into q=0 projections, proj(1,0), in combination with projections not being q=0 projections, i.e., q=0 projections proj(1,0) together with the q≠0 projections proj(−2,1), proj(2,1).

FIG. 6a is an exemplary pixel matrix configuration where pixels are placed out row by row for a matrix configuration having the data size b=64 and the number of k data chunks that also is the same as number of rows in the matrix k=4.

FIG. 6b is a second example of possible layout for the pixel matrix where the pixels are distributed onto the matrix column by column having the data size b=64 and the number of k data chunks that also is the same as number of rows in the matrix k=4.

FIG. 8 is an exemplary graphical representation of a m parity chunk, here P(2,1). This is a representation of the m parity projection P(2,1), to in the same view show both bin and pixel positions, showing for the top row the bin number from 1 to 22 and for the bottom row the sum of the pixel positions for the given bin, summed vertically. The numbers in the matrix are the pixel position numbers, the pixel layout can be done in different ways but here a simple row by row layout to illustrate how aligned m parity projections can work to solve more than one (1) pixel per iteration over the m parity projections, in a way making it possible to get maximum acceleration when using vectorized code. To make this simple, the value of the pixel position and the position id number can be the same.

FIG. 9 is an exemplary aligned m parity chunk package of 3 chunks configured to solve 2 pixels per iteration, having the data size b=64 and the number of k data chunks that also is the same as number of rows in the matrix k=4. M parity chunks P(2,1), P(4,1), P(6,1) here used for the second example.

FIG. 10 an exemplary m parity chunk package after the preamble phase is done as described in Table 1, where zero's indicate that the bins have subtracted the pixel value and inserted the results into the matrix using the Mojette transform for decoding. The end to the preamble phase is when each m parity chunk solves the correct row given by the p value of the m parity chunk and the row number when sorted by size. The sorting can be done ascending or descending based on preferences but in this example the top row is the highest and the bottom the lowest.

FIG. 11a is an exemplary initial step 14 iteration of the example for the stable phase decoding using m parity chunk P(4,1).

FIG. 11b is an exemplary initial step 15 iteration of the example for the stable phase decoding using m parity chunk P(6,1).

FIG. 11c is an exemplary initial step 16 iteration of the example for the stable phase decoding using m parity chunk P(2,1).

FIG. 11d is an exemplary initial step 17 iteration of the example for the stable phase decoding using m parity chunk P(4,1).

FIG. 11e is an exemplary initial step 18 iteration of the example for the stable phase decoding using m parity chunk P(6,1).

FIG. 11f is an exemplary initial step 19 iteration of the example for the stable phase decoding using m parity chunk P(2,1).

FIG. 12 is an exemplary m parity chunk package after in this example also the stable phase of decoding further described in Table 2, where zero's indicate that the bins have subtracted the pixel value and inserted the results into the matrix using the Mojette transform for decoding.

DETAILED DESCRIPTION

Figure 1:
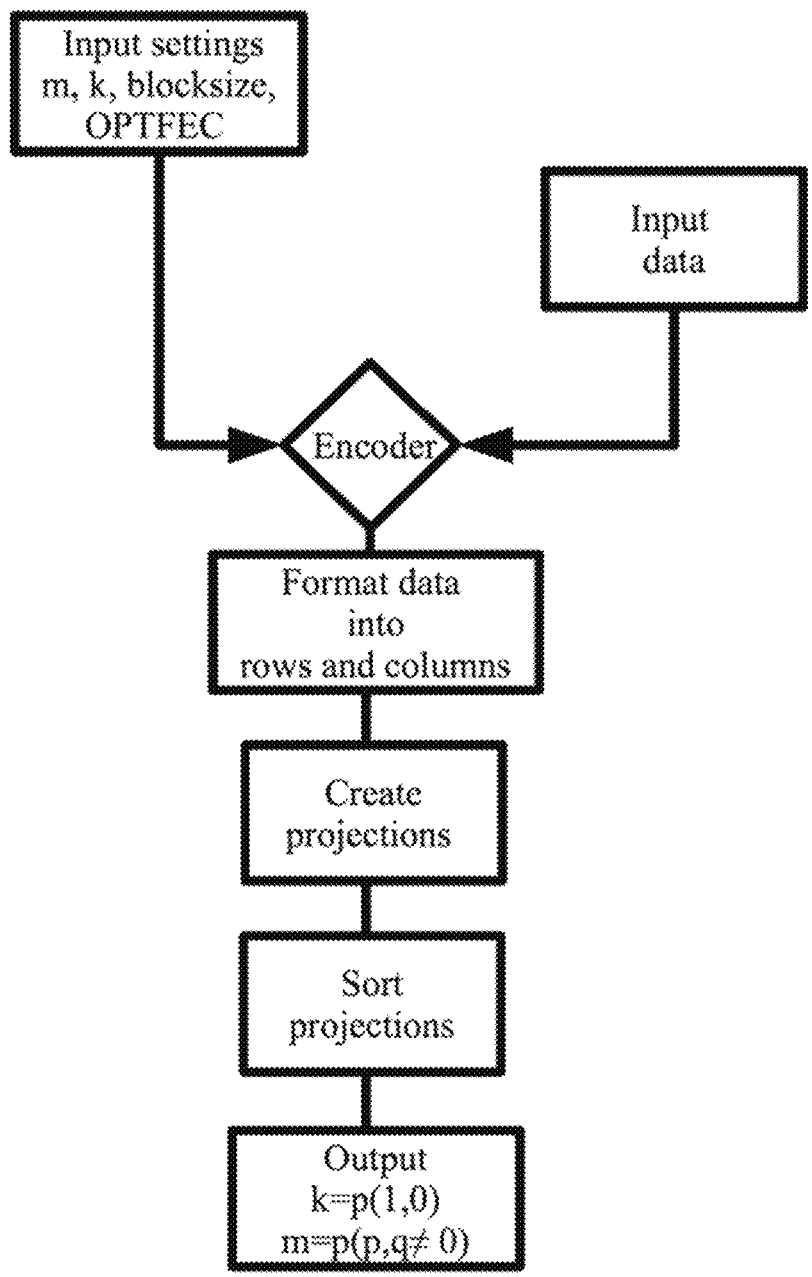
FIG. 1 is a flow diagram illustrating an example algorithm for encoding data.

Referring now to the drawings, wherein like reference numerals designate identical or corresponding parts throughout the several views, there is a great need for a high performance FEC code for distributed data storage over non perfect networks. Preferably, such a code should be adapted for widely distributed storage solutions whereby end-to-end data integrity can be achieved. The code should preferably also provide for a secure and robust way to reconstruct faulty encoded data. Such data faults have become the norm for high-end computing clusters, and even a single error can have profound effects on applications by causing a cascading pattern of corruption, which in most cases spread to other processes.

Storage servers today have large capacities to store data and the intense use of social and surveillance data boosts this need for high availability and distributed storage at low cost. Smaller devices, such as phones, smartphones, tablets and IoT devices, also have a need for higher and higher performance when they generate more and more data to be transferred to stable storage in the cloud or into a private DC.

Data loss in any application is unacceptable and this drives the DC to secure the data by replication to other storages or DCs to, thereby, always have copies of the data. This makes it possible to reconstruct the data if data or storage is lost due to any type of circumstance. Replication is, however, suboptimal when handling large amount of data since all data has to be transferred and replicated in full if a node is lost. Replication also has the implication of having different versions of data on different storages, which makes the handling and maintenance very difficult and work intensive for the administrator. The amount of data in a replication environment is also normally a factor 3 to 7 times the original data due to the above needs for security and having the data distributed around the globe or between offices.

The introduction of erasure coding techniques, such as Reed-Solomon, has greatly improved the situation within DCs. In these situations replication is substituted by RAID, thereby reducing the need for storage capacity by a factor 3 to 5, resulting in cost, environmental, maintenance and safety benefits within the DCs.

In today's erasure code libraries, an industry standard has been established to give different setting parameters a standard name making the integration of different libraries easier into applications. In what follows k denotes the number of data fragments or data chunks for OPTFEC proj(1, 0) projections and also denotes the minimum number of projections for OPTFEC to rebuild the block, and the number of rows in the OPTFEC block. Also, m denotes the number of parity fragments or parity chunks for OPTFEC proj(pi, qi≠0) projections, and also the maximum number of projections that can be lost while still enabling a rebuilding or reconstruction of the data block. Moreover, packet size={bytes} or only b denotes the block-size or file size, giving the size of the matrix of FIGS. 6a and 6b used in encoding and decoding of data according to the exemplary aspects of the present advancements.

The Reed-Solomon erasure code also has a standard implementation where the data generating application is using the non-erasure situation to be able to read and verify data all the way out on the backend storage node. The data generating application then also handles all the calls for data and parity chunks and detects if there is no erasure present and then in the application itself makes the reassembly of the data from the data chunks. If, however, there is a data chunk missing the received number of data chunks together with the necessary number of parity chunks is delivered to the erasure code decoding interface for a decoding operation.

Figure 2:
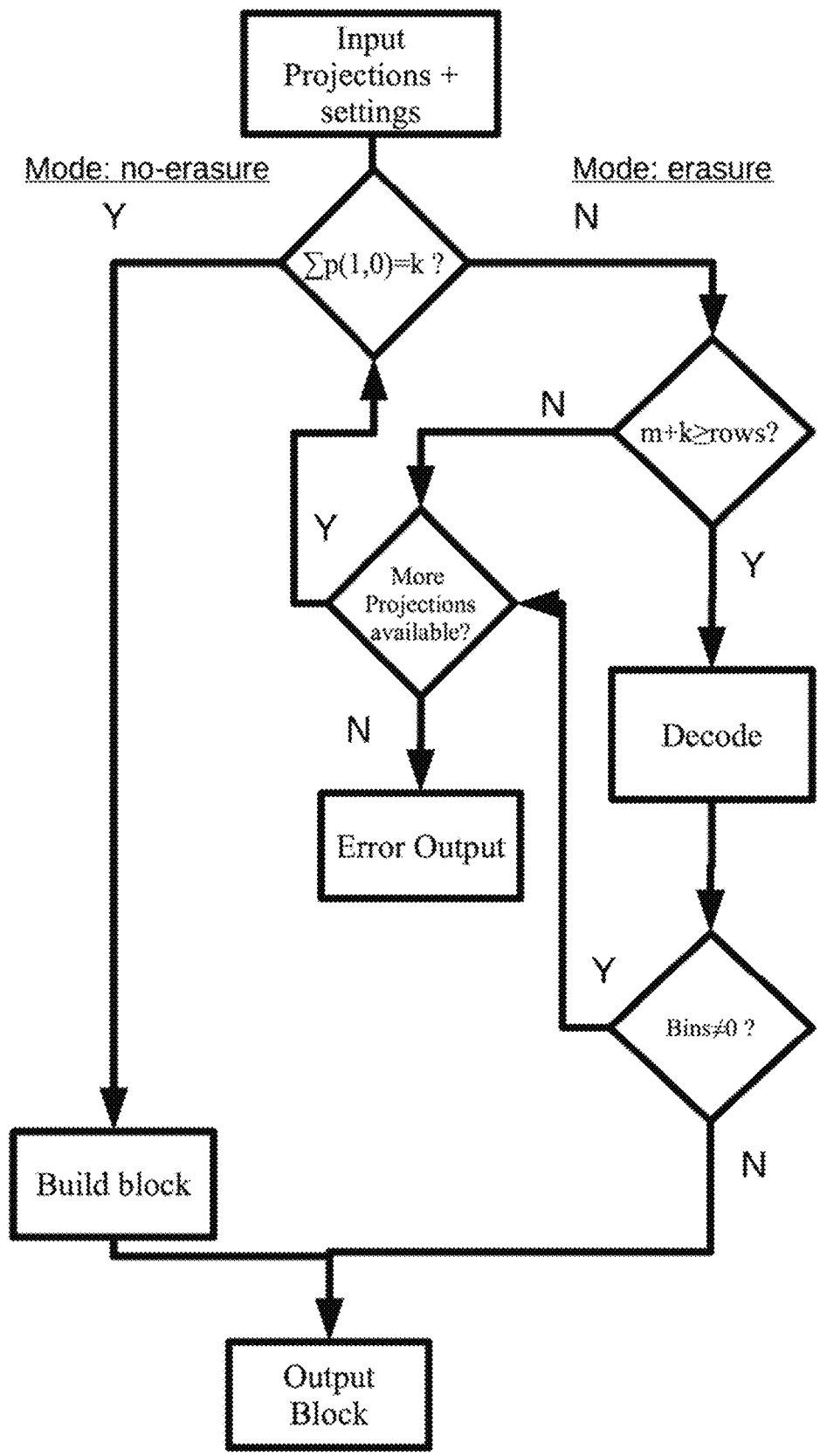
FIG. 2 is a flow diagram illustrating an example algorithm for decoding the data.

The encoding and decoding of the flow diagrams of FIG. 1 and FIG. 2 can be run on an application that is erasure code aware, and the different steps can be divided among different hardware and software layers for an optimal functionality. Both the encoding and decoding operations can be executed on distributed computer nodes to offload intensive calculations and also offload rebuild and data traffic from small low power CPU's on network edges. However, the Reed-Solomon type of erasure codes are not suited for distributed applications where latency can have severe impacts on performance if one node fails, and communication with all other nodes over Internet is needed for the data reconstruction. Thus, for distributed storage applications require an erasure code that is discrete and not Central Processing Unit (CPU) intensive for the client communicating with one or more storage nodes.

Data input for erasure coding is generated from many different sources and applications and then passed, in its full size or as chunks, to the input interface of the erasure code for the encoding operations. The input data can be movie files, document files, executables, live video, or any type of data as one of ordinary skill would recognize. The data delivered to the input interface is transferred into a data matrix that contains the same number of rows as the configuration has k data chunks. The length of the rows are determined by the size of the data delivered to the input interface for the encoding operations or pre-chunked to a specific size either by the application or the erasure code, given by the input configuration settings. The decoder starts to decode the k data chunks row by row and then calculates the m parity chunks determined by the configuration settings for the number of m parity chunks.

When the k data chunks and the m parity chunks are present from the encoder they are transferred to respective configured backend for safe keeping on separate disks or other storage. The backend can be a single disk, or a folder in a filesystem or a storage interface, such as for example S3, NFS or a block device such as ISCSI, as long as the m parity chunks and k data chunks are separated to have redundancy so that not all m and k chunks are lost at once.

After that the encoding is done, the separate m and k chunks do not contain all information needed to reassemble or rebuild and decode the data, and at least k number of chunks need to be supplied to the decoder interface of the erasure code in order to decode the data. That the data cannot be reassembled from different backends without k number of chunks, can also be used for data security purposes when the decoding operation needs to have access to multiple backend storage nodes or disks.

The decoding works according to the given settings to reassemble or decode the data and parity chunks delivered to the interface of the decoder. If less than k number of k data chunks are delivered to the decoder interface, a decoding operation is necessary. If k data chunks are delivered, a reassemble operation can transfer the k data chunk data into the chosen matrix, and depending on the matrix layout and size, the decoding using parity chunks may be unnecessary. If the given settings are set to erasure code aware, the reassembly of the data, if there are no erasures, is done directly by the application. The decoded or reassembled data is then transferred to an interface that is the delivery point of the decoding operation. The data may be chunked by the application when, for example, the data is large in size, such as for movies or big pictures. Such chunking by the application makes transfer over the network and the different operations more efficient. After that all the decoding operations and the reassembly of chunks is completed, the original data is in its original state, even if some backend data nodes were lost, because of the redundancy of the erasure code configuration.

In accordance with exemplary aspects of the present advancements, a novel version of a Mojette transform is used to provide a particular representation of decoded data. In the following, the term "bin" is used to denote a projection element in a Mojette transform projection. Briefly, the Mojette transform is a linear discrete exact Radon transform, in other words a set of l discrete projections describing a discrete image f. Projection angels are chosen among discrete directions $\phi_i = \arctan(q_i/p_i)$, where the subscript i takes on integer values and $p_i$ and $q_i$ are relatively prime, i.e., the greatest common divisor is 1, GCD $(p_i, q_i)=1$. One advantage with these algorithms is that they use only addition and subtraction for the encoding and decoding operations, thereby minimizing the CPU constraints for the operations and making the application fast. The teachings of this paper is hereby incorporate by reference, and in particular the description of the Mojette transform in section 2, the selection of projections in section 3 and the selection of bins in section 4.

A first example for the projections (p,q) p1=(0,1), p2=(1,1), p3=(−1,1) shows that they are well suited for a basic Mojette configuration for storage purposes when this gives a minimum extra data for each calculated projection and has a simple reconstruction pathway. The teachings of this paper is hereby incorporated by reference in full, and in particular the description of Mojette transform in section 2 and the geometry driven reconstruction in section 3. If on the other hand a maximum performance is needed for the decoding operation the m parity projections can be chosen to have a larger epsilon, $\varepsilon \gg 0$. Depending on the CPU to be used the maximum c can be set, and aligned m parity projections calculated, to work as a parity projection package.

A second example includes a configuration where instead of decoding one pixel for each iteration over the m parity projections, two pixels per iteration are decoded. In this erasure code configuration example, the following parameters are used: Blocksize=128, Data chunks (k)=4, Parity chunks(m)=3. For the base case the corresponding projections the are (p,q) p1=(0,1), p2=(1,1), p3=(−1,1) minimizing epsilon $\varepsilon \approx 0$. When a configuration for higher performance is used, the m parity chunks are allowed to increase and the epsilon is $\varepsilon \gg 0$. The corresponding aligned parity projections are, for a case solving a minimum of two pixels per m parity projection iteration, (p,q) p1=(2,1), p2=(4,1), p3=(6,1), where the p value of the aligned m parity projections increase from p1 to p3 with the pixel step 2. When the pixel step is 5 based on the increase in c or other constraints, the aligned m parity chunk package are (p,q) p1=(5,1), p2=(10,1), p3=(15,1). To clarify, an aligned m parity projection package is a number of parity chunks with different p values that has a minimum stable pixel step greater than one per iteration, during the stable phase of the decoding operation. The pixel step is the number of pixels possible to solve per iteration.

The decoding also divided into a minimum of two phases to support the aligned m parity projection packages. These two phases are a preamble phase and a stable phase. If necessary, a post-amble phase may be included if the block size does not even out. The post-amble phase works the same way as the preamble phase with detection of the maximum next size of the pixel step. The end of the pre-amble phase is detected when the sorted m parity projections by p value, solves the correct row, where highest p value solves the top row. The decoder uses a geometry driven reconstruction algorithm for the Mojette Transform and go from left to right, iterating over the m parity projection's to solve a maximum number of pixels per iteration during each phase of the decoding operation, the pre-amble, the stable phase, and if needed the final post-amble phase.

An example is given in Table 1 in which for the given example case the preamble phase is finalized after 13 steps and the decoder is then ready to execute the stable phase where one m parity projection is used to solve one set row in the block.

A bigger $\varepsilon$ accelerates the decoding up to a point, but c can also be increased to a point that hardware/software constraints make further acceleration impossible. Also if not using perfectly aligned m parity projection packages the decoder needs to identify the maximum number of pixies possible to solve for each iteration over the m parity projections, which can make the decoding slower. The minimum number of pixels that can be solved by a perfectly aligned m parity package during the stable phase is the p value pixel step-up between the parity projections. Depending on the configuration and data projections lost, this can be significantly different up to the point of one erasure (one data chunk lost) where a full vectorization can take place for the decoding without any phases when there is always only one pixel to solve for each bin of the m parity projection. The specific one erasure case can be seen as an example in FIG. 5 for details. In this case where a fully vectorized solution for one erasure is not available when the non-systematic Mojette transform does not have any data chunks, and has only m parity chunks for the decoding operation.

A Mojette transformation is a mathematical operation applied on a two-dimensional representation of data. As used herein, it is applied on data blocks in order to obtain an efficient data storage representation of the data. The Mojette transformation may be used as a particular way to encode a data block in order to provide a particular representation of the data block. To this end, the transform takes as input specific data that has been given a form that is suitable to encode using a Mojette transform, e.g., a data block representation. A data block is a particular sequence of information, i.e. bytes or bits, having a particular size that is commonly denoted block size. Data elements or values form part of the sequence of the data block, see e.g., the 6×3 data block illustrated in FIG. 3. When the Mojette transform is applied to the data block a number of projections are obtained. These projections furnish a particular representation of the original data. A beneficial feature obtained by using the Mojette transform is that it only requires arithmetic operations in the form of additions and subtractions. This reduces the computational demands of a CPU of a client that accesses data that has been stored in distributed storage.

The Mojette transform operator or the Mojette projection operator, is applied to a two-dimensional representation of data. Consider the fact that a two-dimensional array, having elements representing certain information carried by the data, can be represented by a discrete function f(k, l) where k and l denotes discrete elements of the array, e.g., pixels or samples. In a two dimensional array these denote the columns and lines or rows, respectively.

The Mojette transform/projection operator is defined as:

$$M\{f(k,l)\} = \text{proj}(p_i, q_i, a) = \Sigma_{k=0}^{Q-1} \Sigma_{l=0}^{P-1} f(k,l)$$
$$\delta(a + p_i l - q_i k)$$

$$M\{f(k,l)\} = \text{proj}(p_i, q_i, a) = \Sigma_{k=0}^{Q-1} \Sigma_{l=0}^{P-1} f(k,l)$$
$$\delta(a + p_i l - q_i k)$$

The summation indices P and Q correspond to the size of the data block, i.e. the data is given a data block representation of size P×Q, a is a number that will specify the line over which the elements, or pixels, are centered. Applying the Mojette transform operator to a particular data block leads to a sum over the elements or pixels that are centered round a particular line $a = p_i l - q_i k$, $a = p_i l - q_i k$, where the particular line can be inferred from the Kronecker delta function $\delta(a) = 1$, if $a = 0$ and 0 otherwise. In what follows a is removed from the argument in $\text{proj}(p_i, q_i, a) \text{proj}(p_i, q_i, a)$ and a projection is simply be denoted by $(p_i, q_i)$. The formula (1) above can be used to generate any projection with any value of p and q. The number B of line sums, also referred to as the number of bins, per projection is given by $$B = (Q-1)|p| + (P-1)|q| + 1 \quad B = (Q-1)|p| + (P-1)|q| + 1$$

In exemplary aspects of the present advancements, calculating the optimal pixel step size. One way to find the optimal pixel step is described below where q=1 and all p values are positive. In this example the input m parity chunks are P(30,1), P(25,1), P(20,1) solving three erasures.

1. Sort the m parity chunks according to their p values. Sorted p values, 30, 25, 20;

2. Calculate the difference between p for each pair of the sorted m parity chunks. The minimum of this calculation also is the minimum stable pixel step that can be used. Difference between the p values are 5, 5;

3. Calculate the pixel step factor by dividing each p value from the sorted m parity chunks by the erasure the chunk is going to solve. For example here three erasures the highest p value will solve the highest erasure. Then also divide with the previous found in step 2, the minimal difference between the p values. 30/(3*5)=2, 25/(2*5)=2.5, 20/(1*5)=4; and 4. Calculate the optimal pixel step by finding the minimal pixel step factor from the above m parity chunks and multiply this with the minimal pixel step previously found in step 2. This now is the maximum stable pixel step that can be used for the m parity chunks in this example. Optimal pixel step is calculated from the minimum difference from step 2 and multiply this with the minimum factor from step 4. Optimal pixel step is in this example 5*2=10.

If negative p values are also used this calculation can be made in the same manner as for the positive. The m parity chunk P(0,1) is unique and needs to be handled separately if using above method to find the optimal pixel step from the input m parity chunks.

Examples of how projections are used in the present advancements are described in detail below.

The exemplary encoding of the data described herein also enables a quick and computationally efficient decoding of the data and also enables a highly efficient reconstruction of faulty data. If erasures occur during decoding, less than k erasures simplify the decoding work. When 1 to k−1 rows are present during decoding in an erasure mode, fewer pixels need to be calculated and restored using m projections proj(pi, q≠0), This allows the decoding to consume less CPU cycles, increasing decoding performance.

If, on the other hand, the number of erasures k for k lost data chunks, the decoding is performed as in a standard non-systematic Mojette decoding using only m projections proj(pi, q≠0) for the full decoding operation. Using aligned projection packages accelerate all decoding modes either in systematic or non-systematic mode, when compared to using a minimal projection package where c is as small as possible. Decoding operations using aligned projection packages (OPTFEC) allows optimization of operations for modern CPU's, FPGA's and GPU's.

The present advancements provide particular mechanism for both encoding and decoding data involving a particular application of two types of projections, $\text{proj}(p_i=1, q_1=0)$ and $\text{proj}(p_i, q\neq 0)$. These projections are used in a particular combination in order to achieve a highly robust encoding of the data. The exemplary encoding of the data according to the present advancements also enables a quick and computationally efficient decoding of the data, as well as enabling a highly efficient reconstruction of faulty data if such data has been detected. The present advancements provide mechanisms whereby the data decoding side can select a particular decoding scheme to use based on information provided by the encoding side, i.e., by performing a particular check on the encoded data. The encoding side and the decoding side are described separately below.

According to a first exemplary aspect of the present advancements a method for generating encoded data includes step S1 of obtaining data in the form of data formatted according to specified settings to comprise rows and columns. The method also comprises the step S2 of creating, by applying an encoding transform on the obtained data block, a set of projections, proj $(p_i, q_1)$, the set of projections including a first number of projections, proj $(p_i=1, q_1=0)$, and a second number of projections, proj $(p_i, q_i\neq 0)$. The second number of projections, proj $(p_i, q_i\neq 0)$, are created by applying an encoding Mojette transform on the data block. The method also comprises the step S3 of outputting the created set of projections to enable a storage of the data in the form of the set of projections.

In slightly different words, there is provided a method that generates encoded data, such as encoded representations of data blocks. The initial, or original form of the data block is provided as input and depends on the particular formatting used. Having obtained the data block the method creates a set of projections by applying an encoding transform on the data block. The encoding transform creates two particular sets of projections. The encoding transform is based on the Mojette transform insofar that projections, proj $(p_i, q_1)$, based on the data block are created. The present advancements uses a novel application of the Mojette transform in order to generate the first number of projections, proj $(p_i=1, q_i=0)$ while the second number of projections, proj $(p_i, q_i\neq 0)$ are created by applying a traditional encoding Mojette transform on the data block. The number of second projections, also referred to as redundancy projections or m-projections, or m parity chunks, may be any number that can be obtained by specifying the indices in proj $(p_i, q_i\neq 0)$, e.g. (1, 1), (1, 2), (1, 3), (2, 1), (2, 2) etc. Hence a large number of redundancy projections may be generated to safeguard the data. The particular step S2 of creating the first number of projections, proj $(p_i=1, q_i=0)$, includes, for example, mapping where each row of the data block to a corresponding projection, proj $(p_1=1, q_i=0)$. This creates projections that carry the same information as a corresponding row. Having created the first and second number of projections the method outputs the created set of projections to enable a storage of the data in the form of the set of projections or parity and data chunks. A client accessing the encoded data may now decode the data according to a proposed decoding mechanism described below.

The projections, proj ($p_i=1$, $q_i=0$), having q=0 have different properties than projections having q≠0 when they have no additional information of the rows. Thus, the proj(1,0) is also identified as a a q=0-projection and is very similar to a chunk in standard applications containing a header that indicates some parameters for the application like, e.g., size or some other parameter, which can be used by the application for, e.g., identification, and can also be used together with, and fully integrated into, a Mojette transform environment along with other projections. These q=0-projections, or data chunk projections, herein identified as q=0 or proj(1,0) projections, can be treated separately since they do not carry any extra redundancy information like the $q_i \neq 0$ projections do. They, therefore, need separate attention with respect to data corruption when used alone, i.e., without any q≠0 projections present during the decoding operation. This is due to the fact that there is no way to verify that the end result is correct without $q_i \neq 0$ projections present. An error with respect to the encoding may be detected by verifying that all bins that have been emptied during the decoding and that each of the bins after the decoding is zero (0), but without the $q_i \neq 0$ projection(s) present during the decoding this is not possible to perform. Having a bin≠0 after decoding provides an indication that an error has occurred during the encoding of the data and new $q_i \neq 0$ projections are needed to 505 exchange a faulty projection before the renewed decoding and verification of the decoded data can take place.

Moreover, the $q_i=0$ projections also have different properties compared with the $q_i \neq 0$ projections when it comes to computations. The first difference is that the q=0 projections have the original size, i.e., the number of pixels in the q=0 projections have the same number of pixels as the original rows of the data block. They are also less computation intensive to calculate since a smaller amount of calculations are needed when performing both encoding and decoding. These properties allows for a reduced computational effort during both encoding and decoding operation and as consequence make the proposed encoding mechanism, referred to herein as OPTFEC, faster. The method, however, also creates a second number of projections, proj ($p_i$, $q_i \neq 0$). This may be done by applying an encoding Mojette transform on the data block. The second number of projections provides redundancy projections that be used to decode the data block if at least one of the first set of projections contains an erasure or has been erroneously encoded. The second number of projections, with $q_i \neq 0$, may thus be created by applying a traditional Mojette transform on the data block. In the end, the different projections together provide a particular representation of the encoded data that allow for a highly efficient decoding where erasure of data or erroneously encoded data swiftly, i.e., with a reduced number of computations, can be correctly reconstructed.

FIG. 1 illustrates in detail an example where the encoding procedure according to the present advancements is used. In step 100 the settings from the application together with settings for the method, i.e. OPTFEC, is received. The settings are used to set the erasure code to the performance, redundancy and durability that the application and user has requested. In Step 110, the erasure code receives input data to be transformed into k+m projections. The input data and the settings from step 100 and step 110 are both feed into the encoder interface in step 120. In step 130 the input data is formatted according to the settings given in step 100, thereby creating k number of rows of the data and a number of columns calculated as: Columns=Block size/rows. In Step 140, the encoding or transformation of the data takes place to create k number of $q_i=0$, i.e. proj(1,0), projections and m number of redundancy projections q≠0, i.e. proj($p_i$, q≠0). For the $q_i=0$ projections there are no standard bins according to Mojette transform. Instead the whole row is saved as a projection. This is be described in more detail when describing FIG. 3.

The created projections have different sizes depending on number of rows and projection angle for the given block and projections. In step 150, the different projections having qi=0 and $q_i \neq 0$ are identified in a way that is suited for later transmission to the application or client. In Step 150, the encoded data is sent as output from the encoder to be stored by the application on preferred backend where k=proj(1,0) and m=proj($p_i$,q≠0) projections.

Below is a detailed description of the decoding side of the present advancements. A method for decoding data uses a dual decoding mode. The method includes a step S10 of acquiring settings. The settings comprises a number k of data fragments and, optionally, a number m of parity fragments together with information about whether erasure code aware mode is active. The settings may further comprise the block size, or packet size b, the matrix size and information about the input file from the application to be encoded. Other parameters may be included as would be recognized by one of ordinary skill. The method also includes the step S20 of obtaining encoded data. The encoded data is encoded by applying an encoding transform on a data block formatted according to the settings, the encoded data comprises a set of projections, proj($p_i$, $q_1$), the set comprising a first number of projections, proj ($p_i=1$, $q_1=0$), and a second number of projections, proj($p_i$, $q_i \neq 0$). The method also includes the step S30 of checking whether the first number of projections, proj ($p_1=1$, $q_1=0$), is equal to the number k of data fragments. At step S40, the method selects, based on the checking, a decoding mode to use for decoding the data, where the decoding mode is either a no-erasure decoding mode or an erasure decoding mode. The method also includes the step S50 of decoding the data utilizing the selected decoding mode in order to reconstruct, or recreate, the data block.

The dual decoding mode described herein includes a first decoding mode that is a no-erasure mode, and a second decoding mode that is an erasure decoding mode. The proposed method comprises sub steps, i.e., steps S10-S40, to determine which of the dual decoding modes to use for a particular encoded data. The method then uses the determined decoding mode to decode the data. Initially, the method acquires the settings used when encoding the data. The settings may be acquired as part of the information obtained when the encoded data is retrieved. The settings may also be predetermined settings or acquired in some other way without departing from the scope of the present advancements. The settings generally include information about at least the number k of data fragments, but may also include the number m of parity fragments, and the block size, or packet size, of the encoded data. The block size may be used to determine either the number of columns or the number of rows of the data block based on the relation: Columns=Block size/rows. Herein the number k denotes the number of data fragments or data chunks for proj(1,0) projections and it also provides a measure for the minimum number of projections needed to be able rebuild the block. The value k may also denote the number of rows in the OPTFEC block. The number m referred to above denotes the number of parity fragments for OPTFEC proj($p_i$, $q_i \neq 0$) projections, and specifies the maximum number of projections that can be lost while still enabling the proposed method to rebuild or reconstruct the data block, i.e., it provides a measure of the redundancy of the system. To clarify, in order to be able to rebuild or reconstruct the original data block a total number of k projections are needed. These k projections does not have to be the k original proj(1,0) projections, but can be a combination of a particular number of the original proj(1,0) projections and a particular number of the proj($p_i$, $q_i \neq 0$) projections. Consider for simplicity the case where k=4 and m=8, here 8 projections can be lost or erased and a reconstruction is still possible, if on the other hand all, or a subset, of the k original proj(1,0) projections are lost, a reconstruction can be made by utilizing the corresponding set or subset of the m proj($p_i$, $q_i \neq 0$) projections. The present advancements therefore provides a large number of possibilities of combining k and m projections in order to reconstruct an erroneous data block.

Having obtained the settings, the method obtains, or receives, the encoded data. The data may be encoded by as described above relative to the method for generating encoded data and as such includes a set of projections. The obtained or received set of projections include the two different sets of projections, of which the first comprises the first number of projections, proj ($p_i=1$, $q_i=0$), and the second comprises the second number of projections, proj($p_i$, $q_i \neq 0$). The method checks whether the obtained number of first projections is equal to the number k acquired with the settings. Based on whether the equality holds or not, the method selects the particular decoding mode to use for the decoding of the data. For example, the method includes the step S40 of selecting a decoding mode by selecting a no-erasure decoding mode if the first number of projections, proj ($p_i=1$, $q_i=0$), is equal to the number k of data fragments. The step (S40) of selecting a decoding mode may also include selecting an erasure decoding mode if the first number of projections, proj ($p_1=1$, $q_i=0$), is less than the number k of data fragments.

By way of example, the exemplary method also includes the step S50 of decoding the data by utilizing the erasure decoding mode includes the further step S51 of controlling whether the set of obtained Mojette projections, proj ($p_i$, $q_1$), are enough for decoding the data block. For example, the method in the step S51 of controlling may also include determining whether the obtained first number of projections, proj ($p_i=1$, $q_i=0$), plus the obtained second number of projections, proj($p_i$, $q_i \neq 0$) is equal to, or larger, than the number of rows of the data block.

In one exemplary aspect, the method also includes the step of requesting further Mojette projections proj($p_j$,$q_j$) if the obtained first number of projections, proj ($p_i=1$, $q_i=0$), plus the obtained second number of projections, proj($p_i$, $q_i \neq 0$) is smaller than the number of rows of the data block. The further Mojette projections proj($p_j$,q) are different from the first number of projections, proj ($p_i=1$, $q_i=0$), and the second number of projections, proj($p_i$, $q_i \neq 0$). In is exemplary aspect, the method may decode the data block by using the first number of projections, proj ($p_1=1$, $q_i=0$), the second number of projections, proj($p_i$, $q_i \neq 0$) and the requested further Mojette projections proj($p_j$,q).

comprises further exemplary aspect includes a method in which the step S40 of decoding also includes determining whether the data has been correctly decoded by checking whether the bins of the decoded data are equal to zero.

The method may also reconstruct encoded data including erasure without the erasure by utilizing the at least one of the obtained second number of projections, proj($p_i$, $q_i \neq 0$). That is, the method may reconstruct an erroneously encoded data, i.e. data block, by utilizing the redundant, or extra, information comprised in the obtained second number of projections, proj($p_i$, $q_i \neq 0$). That the second number of projections comprises redundant, or extra, information is the reason they are referred to as redundancy projections herein.

The decoding method may thus decode data by selecting a particular decoding mode to use. The particular decoding mode that is selected may utilize the redundancy projections to correctly, i.e. without the erasure, reconstruct the initially encoded data block.

FIG. 2 illustrates a decoding example according to the present advancements. In FIG. 2, the decoding method, i.e., the OPTFEC method, decodes data from a number of projections that were generated as described above relative to FIG. 1. In step 200 of FIG. 2, the OPTFEC method receives the input projections and the settings from an application. The projections can be check-summed by the application, or the OPTFEC method may perform the check sum. The check sum is performed in order to detect, as early as possible, whether corrupt data is received. This enables the decoding client to call for new data or request a retransmit if the check sum reveals that the received data is corrupted.

In step 210 the method checks to determine whether the number of proj(1,0) projections are equal to the setting k received in step 200. If the number of proj(1,0) projections are equal to k then these projections, proj(1,0), can be used to rebuild or reconstruct the block directly in step 270. This is referred to as the no-erasure mode. If the number of projections, proj(1,0), is less than k,a dual decoding operation is required, i.e. the erasure decoding mode. These two different modes of operations, no-erasure mode and erasure mode, are also referred to as the dual operation mode.

In step 270 the method rebuilds the block using the proj(1,0) projections received from step 210. In step 220 the method tests if the number of projections received are enough for the rebuild of the block or if more projections needs to be 660 called for. If m+k≥rows, there are enough projections available for performing a decoding in order to recreate or reconstruct the original data. If the m+k is less than number of rows then there are not enough available projections for the rebuild of the original data to take place. Accordingly, the method may request more projections at step 230 by, for example, sending a signal to the application. To clarify, in order to be able to rebuild or reconstruct the original data block a total number of k projections are needed. These k projections does not have to be the k original proj(1,0) projections but can be a combination of a particular number of the original proj(1,0) projections and a particular number of the proj($p_i$, $q_i \neq 0$) projections. Consider for simplicity the case where k=4 and m=8, here 8 projections can be lost or erased and a reconstruction is still possible, if on the other hand all the k original proj(1,0) projections are lost a reconstruction can be made by utilizing the m proj($p_i$, $q_i \neq 0$) projections. The present advancements therefore provide a large number of possibilities of combining k and m projections in order to reconstruct an erroneous data block. If there is no such combination at hand a signal may be sent to request further projections. These further projections may, e.g., be proj($p_i$, $q_i \neq 0$) projections with higher values of $p_i$ and $q_i$. At step 230 a request is placed to ask if there are more redundancy projections available for the rebuild to take place. If there are no more projections available, an error message may be outputted to the application at step 250. At Step 240, the decoding of the projections received is performed to recreate the original data. The output of step 240 is checked in step 260 to verify that the output data is correct. If Bins=0 then the data is correct and the data is sent to step 280. If on the other hand not all Bins are equal to 0 a request for more projections is sent at step 230. At step 280 output to the application/client of the rebuilt or reconstructed data is performed. Here an alignment can also be made to 685 present the data in a correct way to the application/client.

Figure 3:
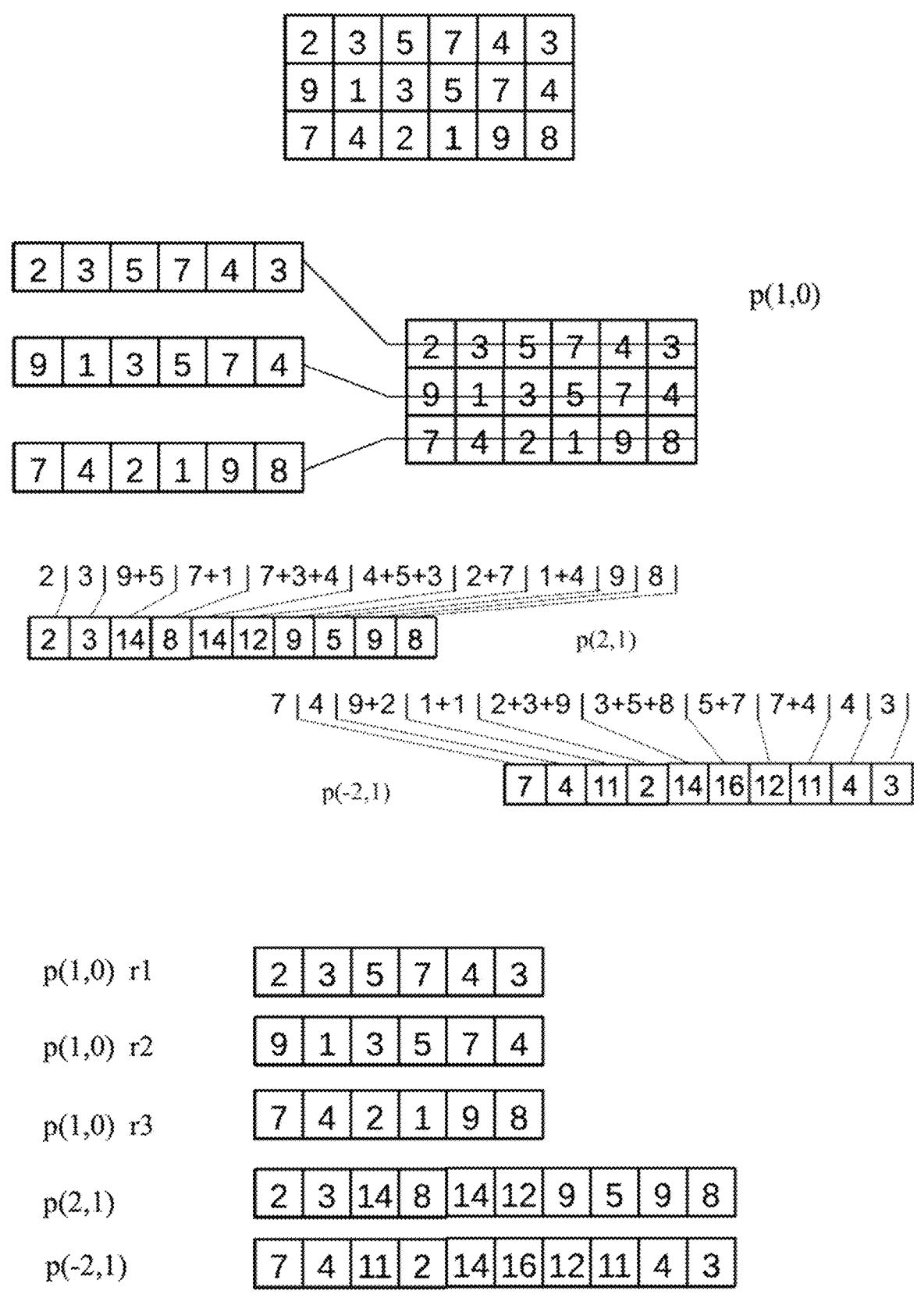

FIG. 3 is an example of OPTFEC encoding of data according to the present advancements. In FIG. 3, the data is formatted with the settings k=3 m=2 and block size=18. In step 300, the input data formatted to the block according to given settings. At step 310 the block is used to generate projections having q=0. Since k=3 three projections proj(1, 0) are produced, one for each of row 1 to row 3, and the handling of the pixels in each row is treated as traditional sums of pixels in Bins as in projections having 00. In step 320 and step 330 two redundancy projections are produced when the input settings states that m=2 in this example. From the OPTFEC setting set by the application and indicating that proj(2,1) and proj(−2,1) should be produced, proj(2,1) is created in step 320 and proj(−2,1) in step 330. In step 340 all projections are displayed showing that m+k=5 and that proj(2,1) and proj(−2,1) are 4 Bins longer than the corresponding proj(1,0). Here a total of 5 projections are produced, three (3) for q=0 and two (2) for redundancy q≠0 in accordance with the input requirement k=3 m=2.

Figure 4:
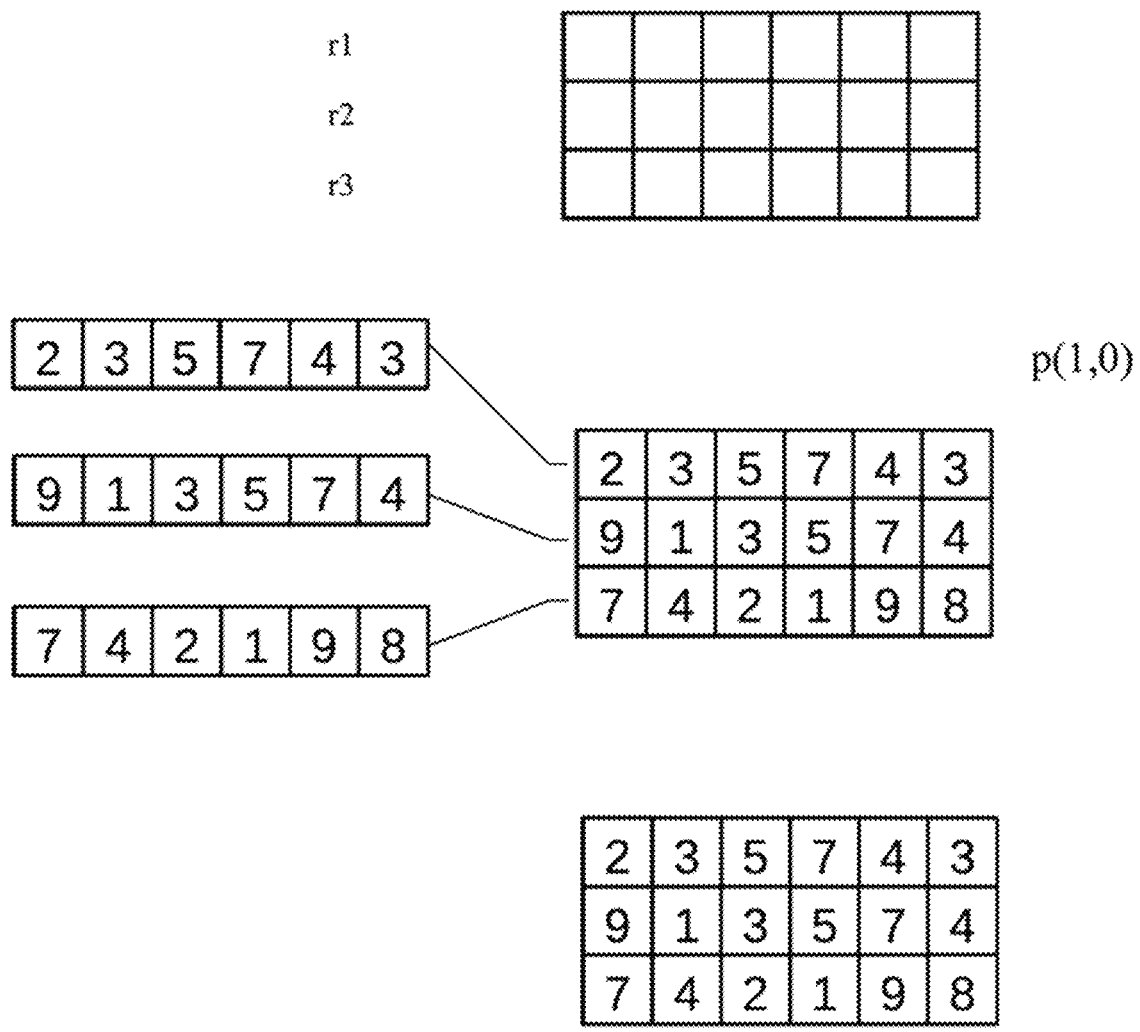
FIG. 4 is a decoding example using the encoded example in FIG. 3 together with the procedure in FIG. 2 without erasure.

FIG. 4 is an example of decoding a block using projections proj(1,0) according to FIG. 2. In this example, the total number of projections having proj(1,0) equal the setting input k also correspond to the number of rows in the block to be rebuilt. In step 400 an empty block corresponding to the given settings in step 100 in FIG. 1 for the encoding of the data is provided. In this example k=3 and m=2 with the block size=18 giving 3 rows and 6 pixels in each row. According to the method of FIG. 2, the number of projections having q=0 is equal to k. Thus, the next step is the building of the block. For projections having q=0 the p represents the row that corresponds to where the data should be inserted. Step 410 shows the insertion of proj(1,0) into row one, step 420 shows the insertion of proj(1,0) for row two into row two and step 430 the proj(1,0) for row three (3) into row number three, rebuilding the block. In step 440 a fully rebuilt block is the shown having 3 rows rebuilt using three projections having q=0.

Figure 5:
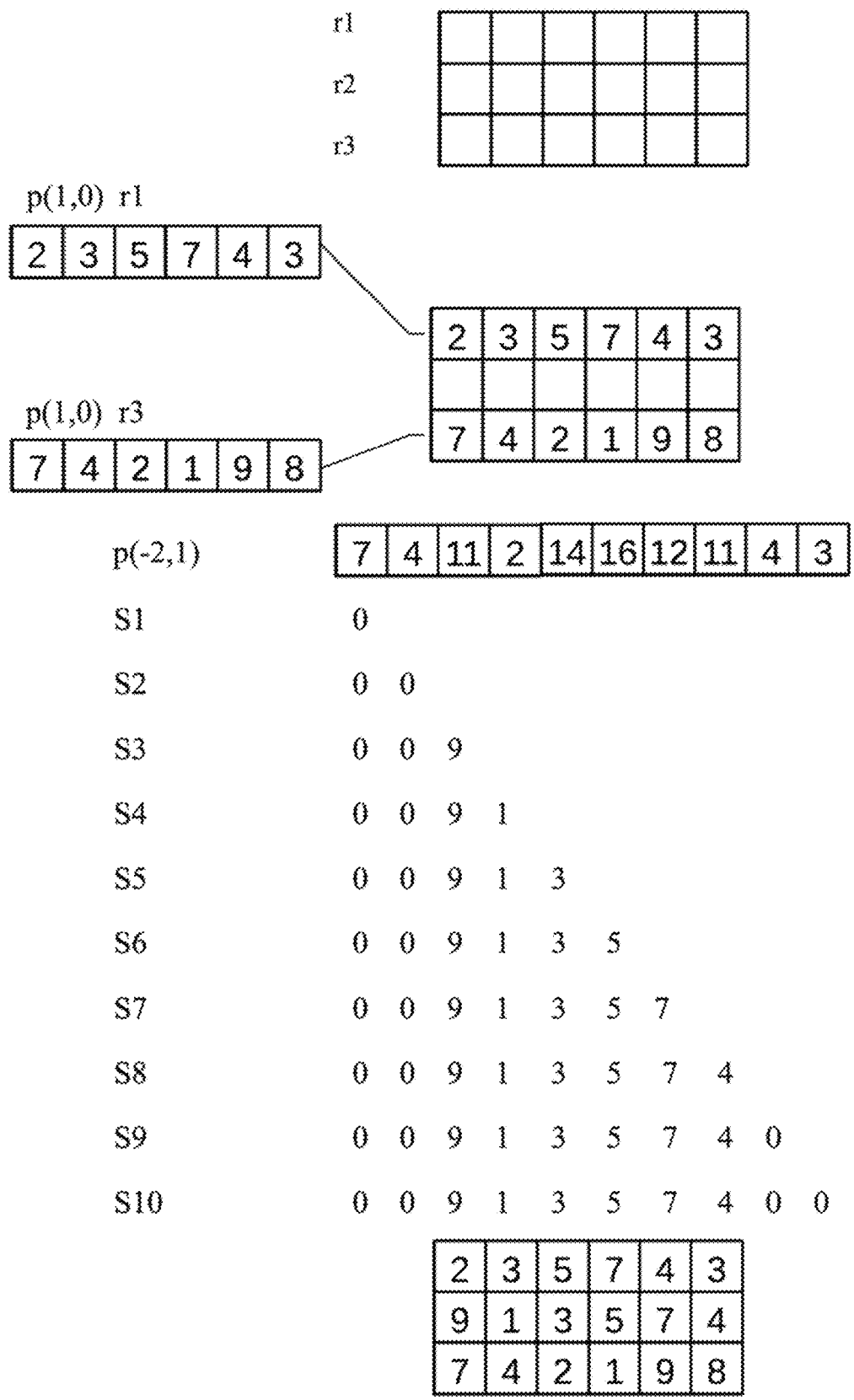
FIG. 5 is a decoding example using the encoded example in FIG. 3 together with the procedure in FIG. 2 having proj(1,0) for row two (2) missing, and erasure present, to rebuild the missing row in the block.

FIG. 5 illustrates the rebuilding of the block when there is erasure present and when there is a loss of one row r2 that needs to be rebuilt using a projection not having q=0. The application provides 3 projections for the erasure to rebuild the block given the settings k=3 and m=2 block size=18. In FIG. 2 step 210 it is determined whether the number of projections having q=0 is less than k. In this case the number of projections having q=0 is not less than k. Therefore, the method proceeds to step 220 which determines that m+k=3, which indicates that decoding per step 240 of FIG. 2 is possible. A detailed example of how this erasure decoding is performed with the projections proj(1,0), proj(−2,1) is described next. In step 500 an empty block is provided that corresponds to the given settings in step 100 in FIG. 1 for the encoding of the data. In this example k=3 and m=2 with the block size=18 (3 rows and 6 pixels in each row r1, r2, r3). In step 510 proj(1,0) is inserted into row one (r1), and step 520 the projection proj(1,0), corresponding to row three (3), is inserted into row number three (r3). Row two (r2) is empty, and the third projection proj(−2,1) is needed for decoding. In step 530 the projection proj(−2,1) is introduced and from these bins a subtraction of the already filled in pixels is performed to rebuild row two (r2). In step 530 S1 using projection proj(−2,1) the already filled in pixel is 7 and by subtracting this pixel from the first bin a 0 is created. That is, 7−7=0. In step 530 S2 the projection is 4 from already present pixels and this then gives 4 from the projections bin minus the 4 from the present projections in the block and subtracting the two gives zero, 4−4=0. S3 to S10 using the same procedure result in: 11−2=9, 2−1=1, 14−2−9=3, 16−3−8=5, 12−5=7, 11−7=4, 4−4=0, 3−3=0, giving the output from the decoding show in step S10, i.e. [0 0 9 1 3 5 7 4 0 0]. For the given projection proj(−2,1) and k=2, m=2 and block size 18 it is pixel 3 to 8 that solves the r2=(9, 1, 3, 5, 7, 4). After this decoding operation the block is reconstructed using Mojette decoding in step 540.

According to an exemplary aspect, the method may be supplemented with a Cyclic Redundancy Check, CRC, performed on the initial or original data block. Ensuring that the initial data block does not contain corrupted data increases the efficiency of the method whereby the data is subject to the Mojette transform to obtain multiple Mojette transform projections $(p_i, q_i)$. Thus, in exemplary aspects, the method further includes performing a CRC on the initial data, and the method only applies the Mojette transform on the data block if the CRC sum is correct. This ensures that a client does not need to perform a Mojette decoding on the data if the data is corrupted, increasing efficiency.

The method can also be supplemented with a Streaming SIMD Extensions (SSE) extension for the acceleration of encoding and decoding operations. This embodiment can also use programmable hardware devices to accelerate the encoding and decoding operation, such as field-programmable gate array (FPGA). Having aligned parity projection packages present, a very efficient SSE accelerated vectorized code can be created that greatly reduces the number of CPU cycles necessary for the decoding process when an erasure is present. The same is also true for the implementation on FPGA or Graphics Processing Unit (GPU) where even more cores can work in parallel to simultaneous solve the decoding effort when an erasure is present.

The following are examples of a aligned m parity chunk package using the following configuration settings for the encoding and decoding operations. Encoding configuration: Blocksize=64, Data chunks (k)=4, Parity chunks(m)=3, Parity projections (p,q) p1=(2,1), p2=(4,1), p3=(6,1)

This encoding is performed according to FIG. 3 using Mojette Transform for the above given encoding configuration.

Decoding: Data chunk for row 1, 2, and 4 are lost and the operation is in erasure mode, and the following m parity projections are used p1=(2,1), p2=(4,1), p3=(6,1) and the k data chunk for row 3 to be used for the rebuild of the data Table 1 below shows the first 13 steps of the preamble phase (unstable) decoding operation where 3 k data chunks are lost and 3 m parity chunks used to replace de lost data chunks during the decoding operation.

TABLE 1

| Preamble phase (unstable) | | | | |
|---|---|---|---|---|
| Step | Projection | Position/Pixels | Solved row | Right/Wrong |
| 1 | P(2, 1) | 1 and 2 | 1 | W |
| 2 | P(4, 1) | 3 and 4 | 1 | W |
| 3 | P(6, 1) | 5 and 6 | 1 | R |
| 4 | P(2, 1) | 17 and 18 | 2 | W |
| 5 | P(4, 1) | None | — | W |
| 6 | P(6, 1) | 7 and 8 | 1 | R |
| 7 | P(2, 1) | 19 and 20 | 2 | W |
| 8 | P(4, 1) | None | — | W |
| 9 | P(6, 1) | 9 and 10 | 1 | R |
| 10 | P(2, 1) | None | — | W |

TABLE 1-continued

Preamble phase (unstable)

| Step | Projection | Position/Pixels | Solved row | Right/Wrong |
|------|-----------|-----------------|------------|-------------|
| 11 | P(4, 1) | 21 and 22 | 2 | R |
| 12 | P(6, 1) | 11 and 12 | 1 | R |
| 13 | P(2, 1) | 49 and 50 | 4 | R |

An iteration over each m parity chunk is made, here in the order P(2,1), P(4,1), P(6,1) and the table shows column one the first iteration step. In column two the m parity chunk used, in column three the solved pixels, in column 4 the row where the solved pixels belongs to, and in column 5 if this is the correct row to solve for the m parity projection used during this iteration step Right or Wrong is indicated. The end to the preamble phase, indicating R or W in column 5 in Table 1, is reached when each m parity chunk solves the correct row given by the p value of the m parity chunk and the row number when sorted by size. This is indicated in Table 1 at steps 11, 12, and 13. The sorting can be done ascending or descending depending on preferences, but in this example the top row is the highest and the bottom the lowest.

What characterizes this the preamble (unstable) phase is that as shown in Table 1 not all iterations will solve pixels as here in step 5, 8, and 10. For an ideal situation as in the later stable phase, described below, the number of aligned pixels given by the configuration can be solved in each iteration.

Figure 7:
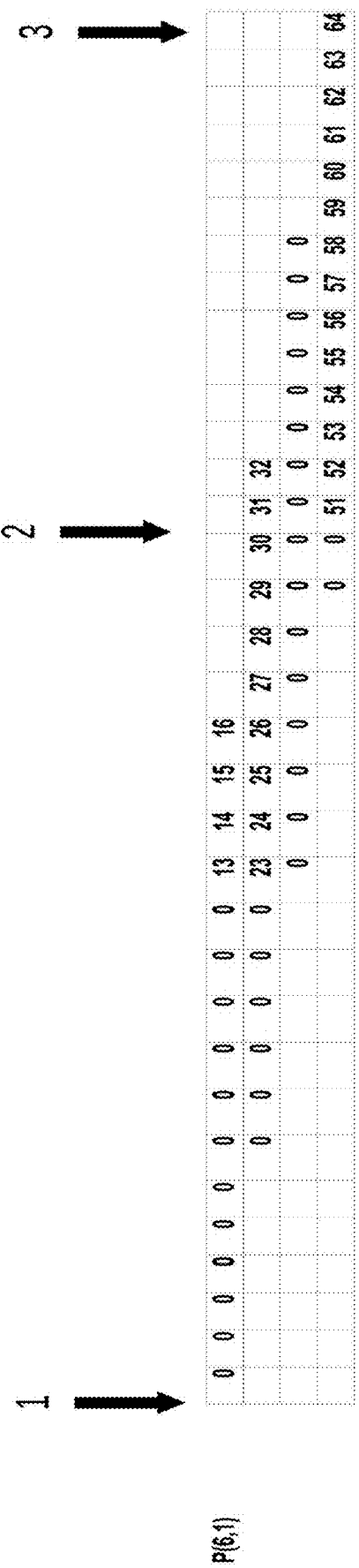
FIG. 7 is an example of the different phases of the decoding operation. The Pre-amble 1-2 phase, the stable 2-3 phase and here no post-amble phase (3–end) when this is even out for the given configuration example, of the decoding. The phases are different in size when shown on real world data sizes i.e. 4 kb or bigger making the pre-amble and post-amble phases very short compared with the stable.

The different phases in the decoding operation is shown in FIG. 7 where the phase between 1 and 2 is the unstable preamble phase and 2 to 3 is the stable and here not shown 3—end is the post-amble phase. Table 1 illustrates for the second example the preamble phase and identified why this is the unstable phase where the correct number of pixels and the correct row is not always solved correctly during each iteration over the m number of parity chunks.

Table 2 shows the decoding operations during the stable phase solving in this example the number of aligned pixels per iteration step 14 to 19.

TABLE 2 for the stable phase iterations

| Step | Projection | Position/Pixels | Solved row | Right/Wrong |
|------|-----------|-----------------|------------|-------------|
| 14 | P(4, 1) | 23 and 24 | 2 | R |
| 15 | P(6, 1) | 13 and 14 | 1 | R |
| 16 | P(2, 1) | 51 and 52 | 4 | R |
| 17 | P(4, 1) | 25 and 26 | 2 | R |
| 18 | P(6, 1) | 15 and 16 | 1 | R |
| 19 | P(2, 1) | 53 and 54 | 4 | R |

When comparing Table 1 to Table 2, column 5 Right/Wrong in Table 2 is stable, i.e., always R, and the used m parity chunk in the iteration solves the correct row in the matrix each time making the decoding operation very efficient and simple. In FIG. 7 the stable phase between 2 and 3 for the second example iteration over the m number of parity chunks illustrate that this is the stable phase where each iteration or step solves at minimum the aligned number of pixels and the sorted m parity chunks solves the sorted correct row.

Next, encoding/decoding of multiple pixels is explained. In these explanations, the multiple pixels per iteration solutions employ aligned m parity projection packages. In FIG. 8 an exemplary layout of m parity chunk P(2,1) illustrates pixel positioning depending on the matrix layout as discussed above relative to FIG. 6a, FIG. 6b and the bin id number and the actual bin. The top row indicates the bin id number from left to right, starting from 1 and ending with 22. Below the bin id number row is a representation of the m parity chunk P(2,1) where each row in the matrix is moved two steps to the right based on the p value of P(2,1) m parity chunk. The bins are then calculated by summing each bin id number column down, shown as the Sum Bin row from bin id number 1 to 22. The bin id numbers 1 and 2 have different properties than the bin id numbers 3 to 20 and this pattern repeats for bin id numbers 21 and 22. The first 2 and the last 2 bin id numbers are free and do not depend on any other k data chunk or m parity chunk. These bin id numbers are solved on their own. This feature advantageously allow for direct transfer of the data from that pixel position directly into the data matrix. In this case the values in the these pixel positions, 1 and 2 and 63 and 64, are directly transferred to the solution data matrix. When this data is transferred to the solution data matrix, each m parity chunk must be updated. in this example for FIG. 8 the information for pixels 1, 2, 63 and 64 is updated by subtracting the information in the pixels 1, 2, 63 and 64 from the respective pixel position in each bin containing these pixel positions, for the other m parity chunks.

Figure 9:
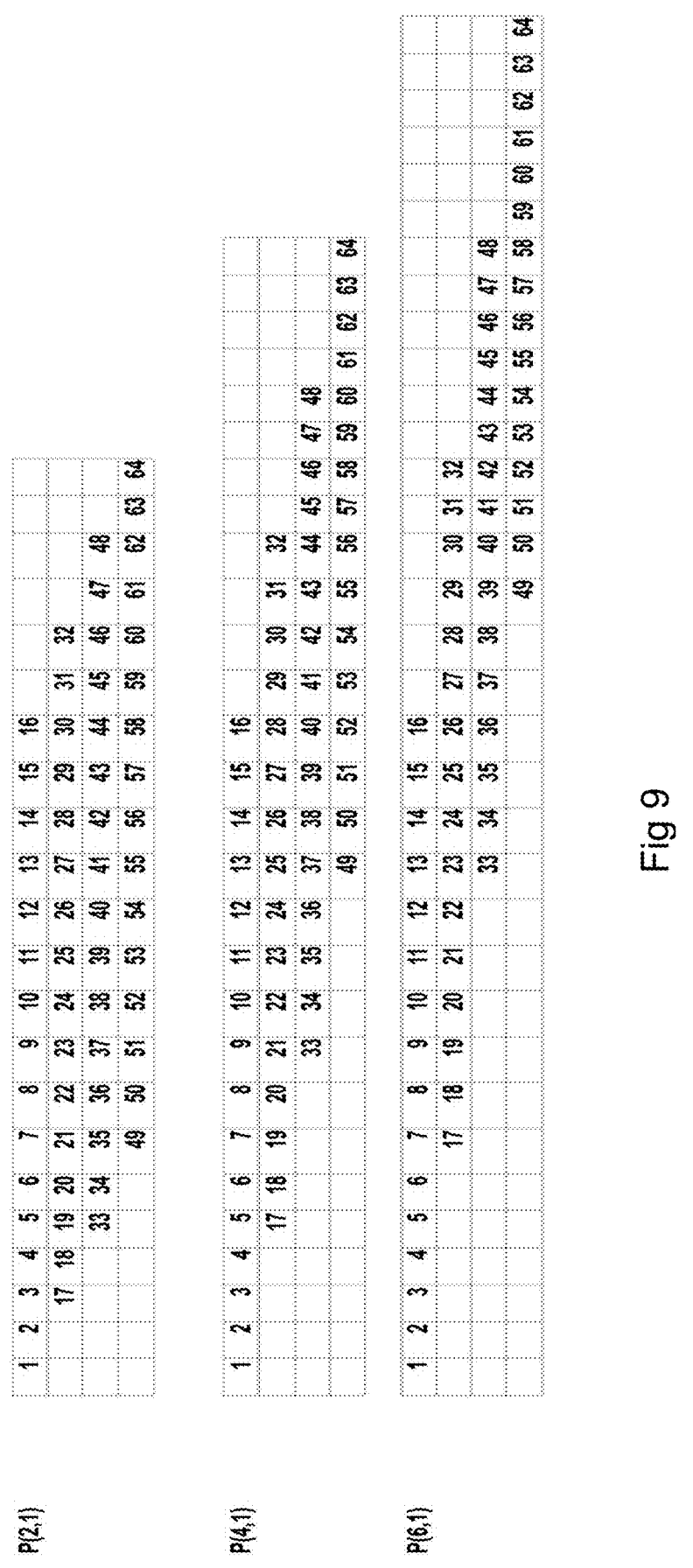

FIG. 9 is the graphical representation of the example of FIG. 8. In that example, an m parity chunk package is aligned to solve minimum two pixels per iteration depending on number of erasures and data chunk or m parity chunk that was lost. As in FIG. 8, here P(2,1) contains 2+2 free pixels, P(4,1) contains 4+4 free pixels and P(6,1) contains 6+6 free pixels. The respective m parity chunk graphical representations has moved the rows to the right given by the p value of the m parity chunk as explained in detail in FIG. 8. For a negative p value in this example the rows are moved to the left by the p value of the m parity chunk as explained in detail in FIG. 8. Aligned m parity chunk packages to solve multiple pixels per iteration over each m parity chunk during a decoding operation, can be set up to use both all positive p values, positive and negative and all negative, where the minimum absolute m parity chunks p value will denote the maximum number of pixels that can be solved during a stable phase with the same number of pixels solved per iteration, given that the m parity chunks with the minimum values are used for the decoding operation.

Figure 10:
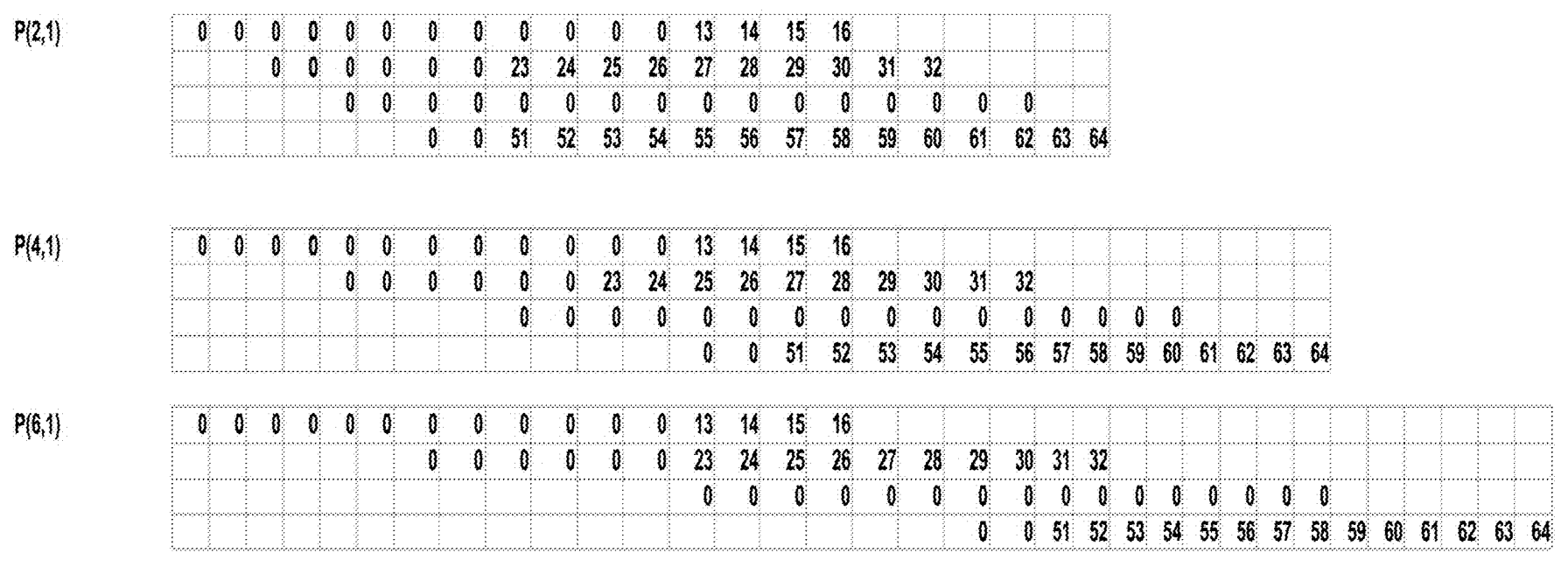

The status of them parity chunk package in the second example is in FIG. 10 which illustrates the data after the preamble phase is finished. This is also shown in Table 1. Here the zeros represent already solved pixel positions, and P(4,1) m parity projection contains two free pixel positions 23 and 24.

Figure 11A:
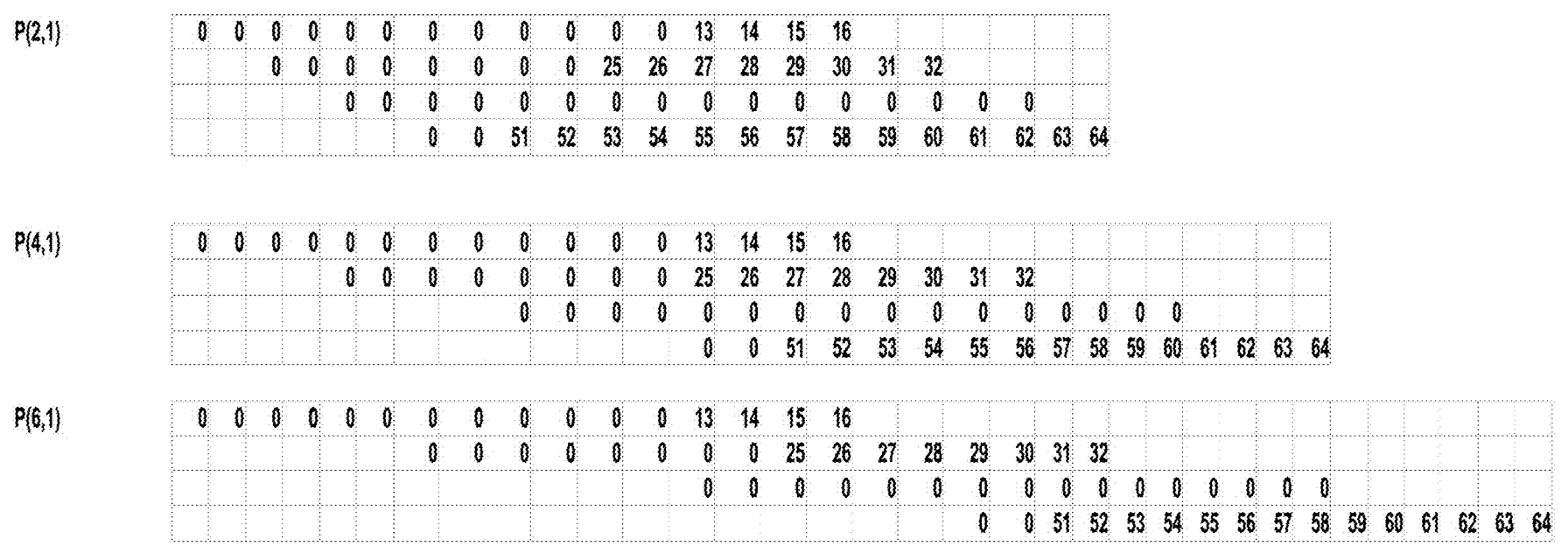

FIG. 11a is the status after step 14 of Table 2 is carried out to solve pixels 23 and 24 and reducing each bin in the other m parity projections for the solved pixels. As can be appreciated, this step solves pixels 23 and 24 and frees two pixels in m parity chunk P(6,1) pixel positions 13 and 14 that now can be solved using the same procedure. The described procedure moves from left to right, but the procedure can also move from right to left, or move from both directions at once without departing from the scope of the present advancements. Thus, orientation of the matrix and the direction of the solution is fully flexible.

Figure 11B:
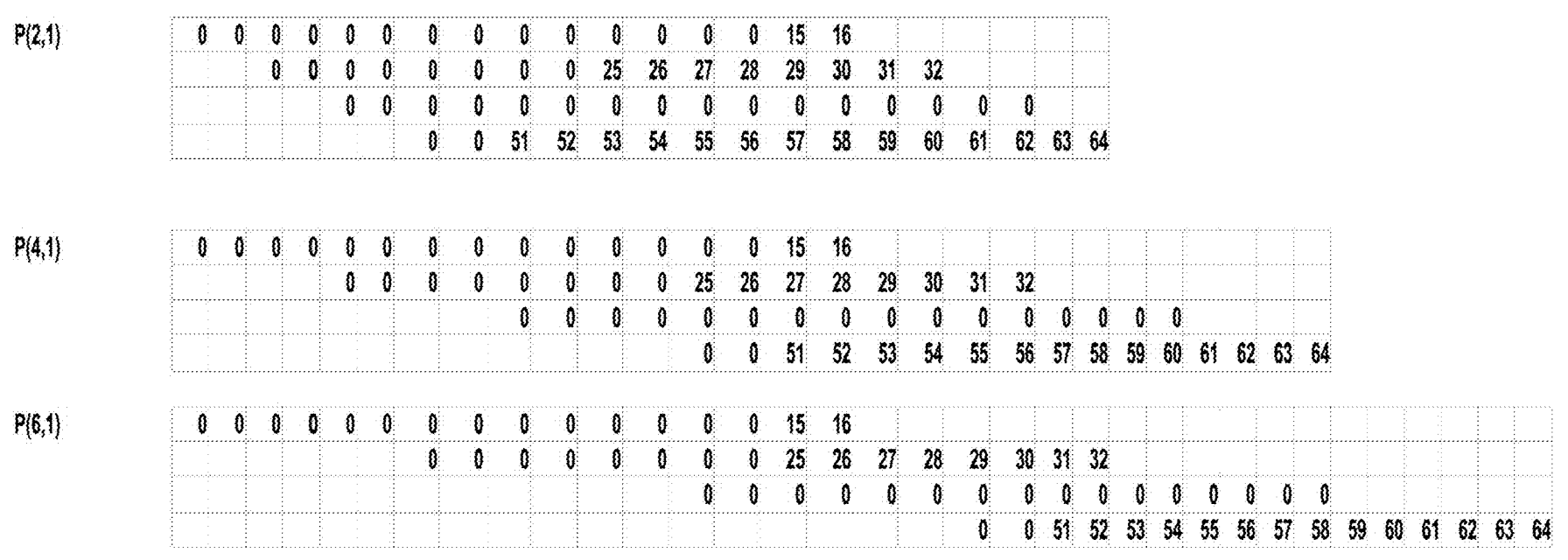
Figure 11C:
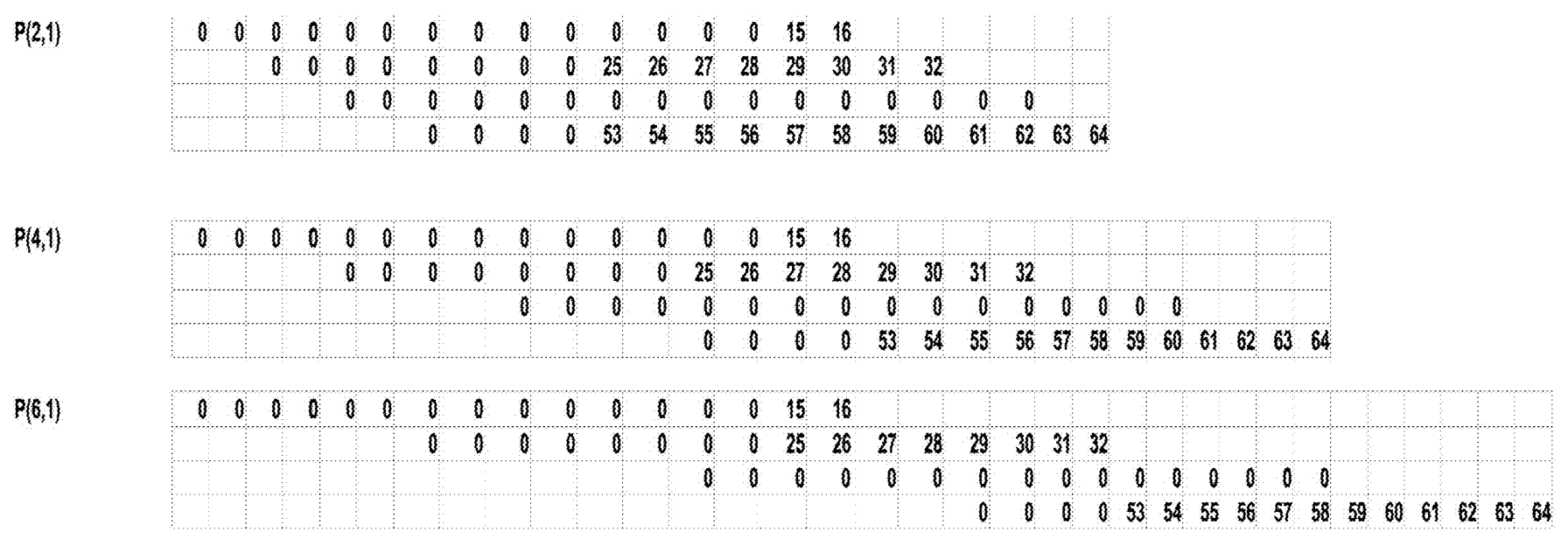
Figure 11D:
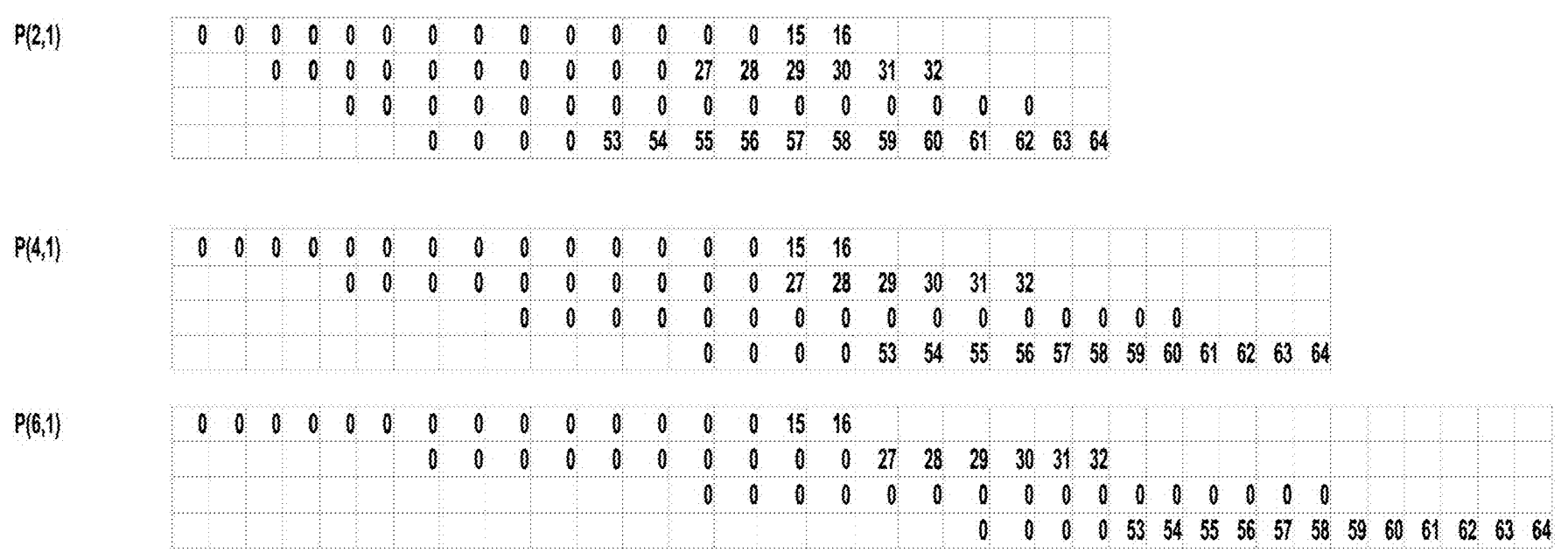
Figure 11E:
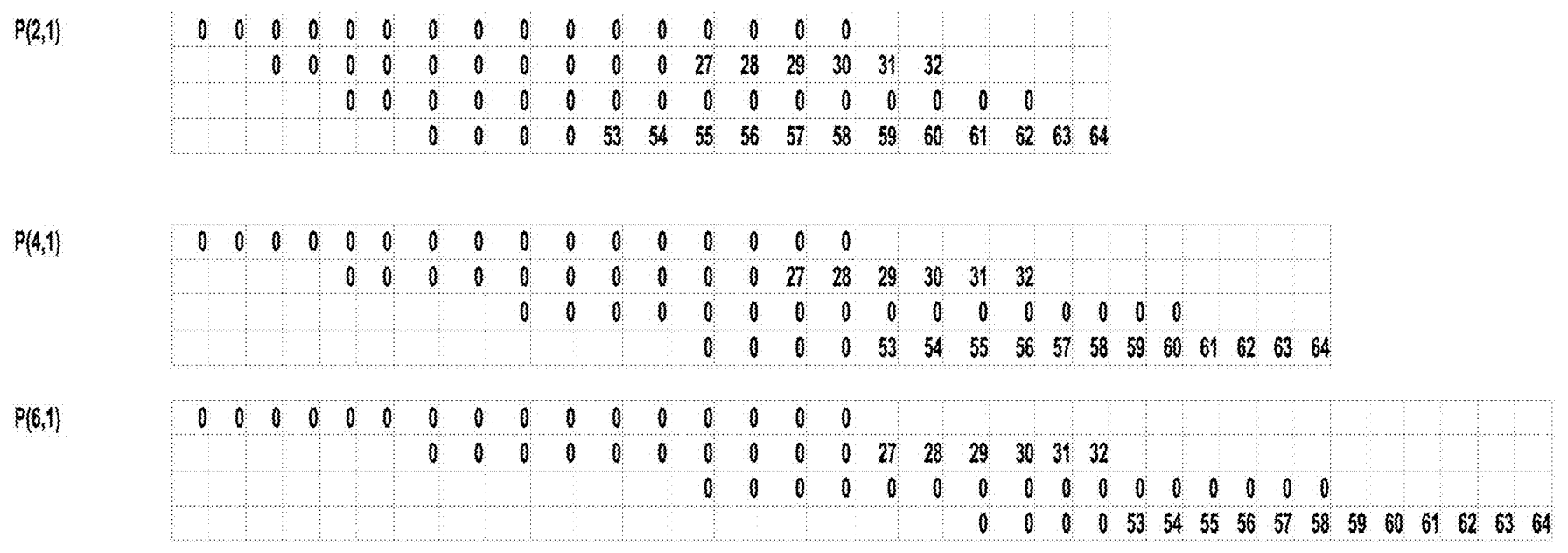
Figure 11F:
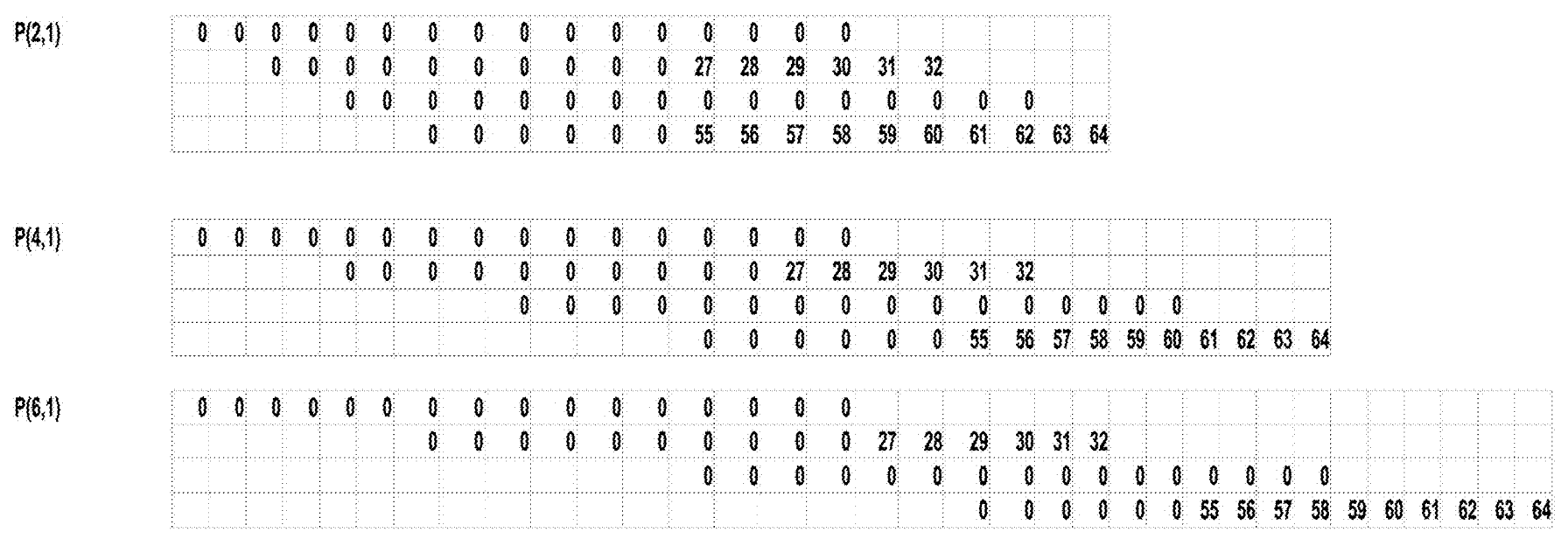

In FIG. 11b pixel positions 13 and 14 that are connected to the top row are solved by the m parity projection with the highest p value, as discussed above with reference to step 15 of Table 1. Step 16 of Table 1 corresponds to FIG. 11c where m parity projection having the lowest p value P(2,1) solves pixel positions 51 and 52 positioned in bottom row in the matrix. FIG. 11d uses the same procedure used to solve pixel position 25 and 26, and FIG. 11e is the solution for pixel position 15 and 16 for this the second example. FIG. 11f uses a left to right procedure for the solution for pixel position 53 and 54. All pixies in this stable phase are solved by the correct m parity chunk and also the stable basic or minimum pixel positions is given by the minimum absolute p value used per iteration.

Figure 12:
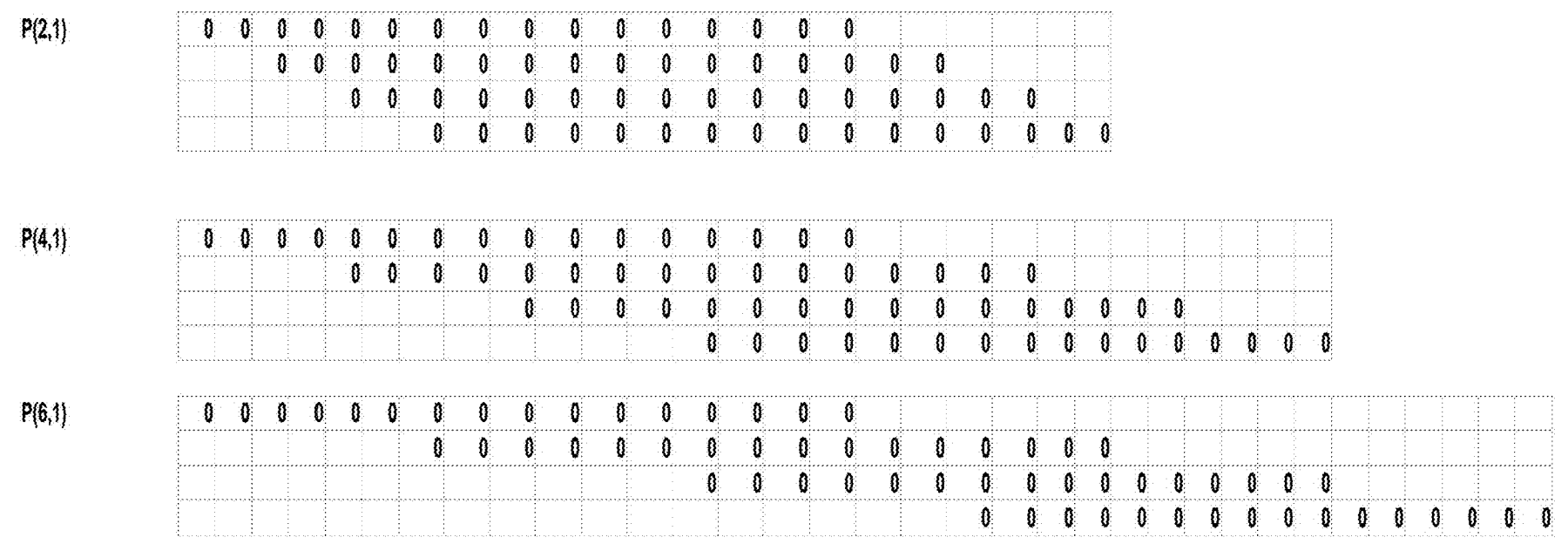

FIG. 12 is the m parity projection package after all pixel positions are solved. If all bins do not equal zero by the end of the decoding operation an error is present and the decoding operation was not successful or the given chunks contained errors.

Next apparatuses according to exemplary aspects are described. As can be appreciated, the above described methods may be performed by these apparatuses without limitation.

As can be appreciated, the methods described herein can be implemented, combined and re-arranged in a variety of ways without departing from the present advancements. For example, embodiments may be implemented in hardware, or in software for execution by suitable processing circuitry, or a combination thereof. The steps, functions, procedures and/or blocks described herein may therefore be implemented in hardware using any conventional technology, such as discrete circuit or integrated circuit technology, including both general-purpose electronic circuitry and application-specific circuitry. Alternatively, or as a complement, at least some of the steps, functions, procedures and/or blocks described herein may be implemented in software such as a computer program for execution by suitable processing circuitry such as one or more processors or processing units. Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device in which the proposed technology is implemented. It may also be possible to re-use existing software, e.g. by reprogramming of the existing software or by adding new software components.

In exemplary aspects, the present advancements also include an apparatus 100 for generating encoded data. The apparatus 100 is configured to obtain data in the form of a data block formatted according to specified settings to comprise rows and columns. The apparatus 100 is also configured to create, by applying an encoding transform on the obtained data block, a set of projections, proj ($p_i$, $q_i$), the set comprising a first number of projections, proj ($p_i=1$, $q_i=0$), and a second number of projections, proj ($p_i$, $q_i \neq 0$), the second number of projections proj ($p_i$, $q_i \neq 0$) being created by applying an encoding Mojette transform on the data block. The apparatus 100 is further configured to output the created Mojette projections to enable a storage of the data in the form of the Mojette projections.

The apparatus 100 may also be configured to create a set of projections, proj ($p_i$, $q_1$), and may be configured to create the first number of projections, proj ($p_i=1$, $q_i=0$), by mapping each row to a corresponding projection, proj ($p_i=1$, $q_i=0$), in order to create projections carrying the same information as a corresponding row.

Another embodiment of the apparatus comprises an apparatus 100 that is configured to create a set of projections, proj ($p_i$, $q_i$), and may be configured to create the second number of projections proj ($p_i$, $q_i \neq 0$) by applying an encoding Mojette transform on the data block, the second number of projections providing redundancy projections to be used to decode the data block if at least one of the first set of projections contains an erasure or has been erroneously encoded.

Figure 13A:
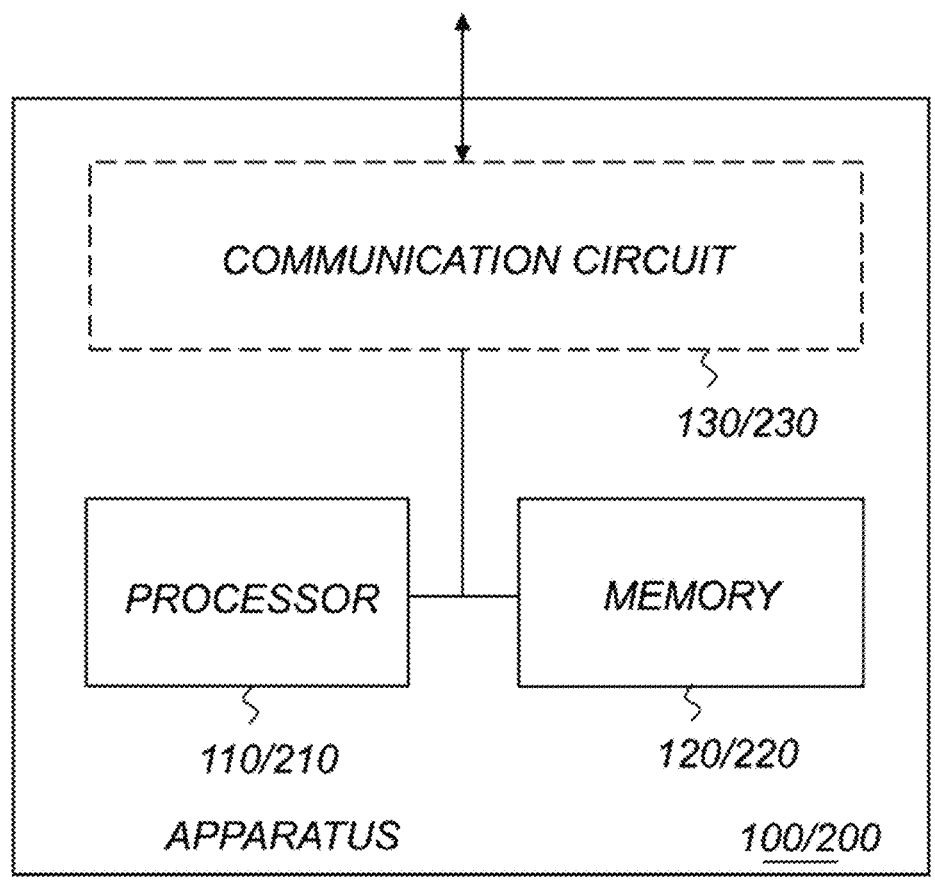
FIG. 13a is a block diagram illustrating an apparatus for performing the encoding according to exemplary aspects of the present advancements.

FIG. 13a is a schematic block diagram of an example of an apparatus 100 according to the proposed technology. In FIG. 13a, the apparatus 100 includes at 920 least one processor 110 and a memory 120, the memory 120 comprising instructions, which when executed by the at least one processor 110, cause the at least one processor 110 to generate encoded data.

The apparatus 100 may also include a communication circuit 130. The communication circuit 130 may include functions for wired and/or wireless 925 communication with other devices in a network. In a particular example, the communication circuit 130 may be based on radio circuitry for communication with one or more other nodes, including transmitting and/or receiving information. Wired communication, i.e. exchange of data over a wired network, is however equally possible. The communication circuit 130 may be interconnected to the processor 110 and/or memory 120. The communication circuit 130 may be interconnected to a hardware circuitry 110. By way of example, the communication circuit 130 may include any of the following: a receiver, a transmitter, a transceiver, input/output (I/O) circuitry, input port(s) and/or output port(s).

An apparatus 200 may be configured to decode data by utilizing a dual decoding mode. The apparatus 200 is configured to acquire settings that include a number k of data fragments and a number m of parity fragments. The settings can also include the block size, packet size, of the encoded data. The apparatus 200 is also configured to obtain encoded data, encoded by applying an encoding Mojette transform on a data block formatted according to the settings. The encoded data includes a set of Mojette projections, proj ($p_i$, $q_i$), and the set includes a first number of projections, proj ($p_i=1$, $q_i=0$), and a second number of projections, proj($p_i$, $q_i \neq 0$). The apparatus 200 is also configured to check whether the first number of projections, proj ($p_i=1$, $q_i=0$), is equal to the number k of data fragments. The apparatus 200 is also configured to select, based on the check, a decoding mode to use for decoding the data, the decoding mode being either a no-erasure decoding mode or an erasure decoding mode. The apparatus 200 is further configured to decode the data utilizing the selected decoding mode in order to recreate the data block.

The apparatus 200 may also be configured to select a decoding mode by being configured to select a no-erasure decoding mode if the first number of projections, proj ($p_i=1$, $q_i=0$), is equal to the number k of data fragments. The apparatus 200 may also be configured to select a decoding mode by being configured to select an erasure decoding mode if the first number of projections, proj ($p_i=1$, $q_i=0$), is less than the number k of data fragments. The apparatus may also investigate whether the set of obtained Mojette projections, proj ($p_i$, $q_1$), are enough for decoding the data block.

The apparatus 200 can be configured to investigate whether the set of obtained Mojette projections, proj ($p_i$, $q_i$), are enough for decoding the data block by determining whether the obtained first number of projections, proj ($p_i=1$, $q_i=0$), plus the obtained second number of projections, proj($p_i$, $q_i \neq 0$) is equal to, or larger, than the number of rows of the data block. The apparatus 200 may also request further Mojette projections proj($p_j,q_j$) if the obtained first number of projections, proj ($p_i=1$, $q_i=0$), plus the obtained second number of projections, proj($p_i$, $q_i\neq 0$) is smaller than the number of rows of the data block, the further Mojette projections proj($p_j,q_j$) being different from the first number of projections, proj ($p_i=1$, $q_i=0$), and the second number of projections, proj($p_i$, $q_i\neq 0$).

The apparatus 200 can also decode the data block by using the first number of projections, proj ($p_i=1$, $q_i=0$), the second number of projections, proj($p_i$, $q_i\neq 0$) and the requested further Mojette projections proj($p_j,q$). The apparatus 200 determines whether the data has been correctly decoded by checking whether the bins of the decoded data is equal to zero.

FIG. 13*a* is a block diagram illustrating a possible embodiment of the apparatus 200 according to exemplary aspects of the present advancements. The apparatus 200 includes at least one processor 210 and memory 220, the memory 220 comprising instructions, which when executed by the at least one processor 210, cause the at least one processor 210 to decode data by utilizing a dual decoding mode. The apparatus 200 may also include communication circuitry 230 as described above.

Figure 13B:
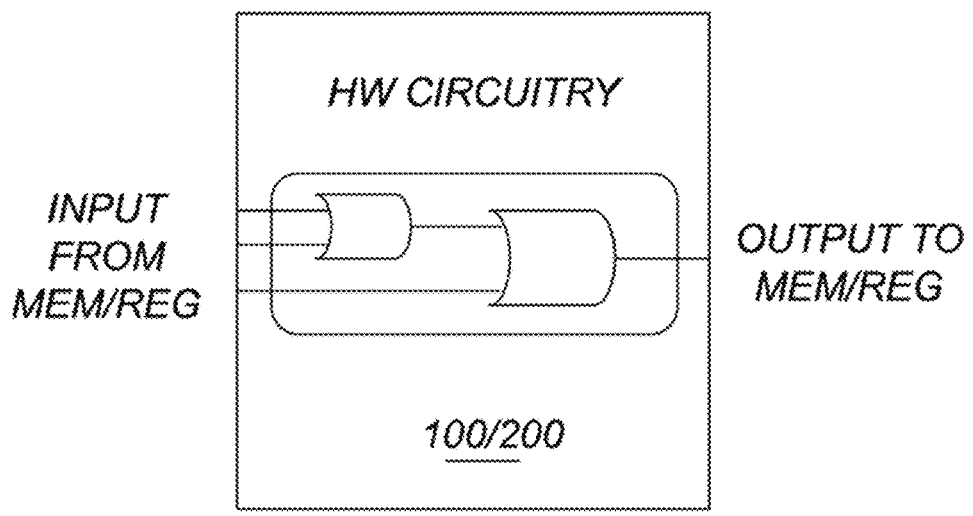
FIG. 13b is a block diagram illustrating an apparatus for performing the encoding according to exemplary aspects of the present advancements.

The methods described herein may implemented by apparatuses 100 and 200 that are based on a hardware circuitry, as illustrated in FIG. 13*b*. The hardware circuitry may include Application Specific Integrated Circuits (ASICs), Field Programmable Gate Arrays (FPGAs), or any other hardware logic, such as discrete logic gates and/or flip-flops interconnected to perform specialized functions in connection with suitable registers (REG) and/or memory circuits (MEM).

Figure 14:
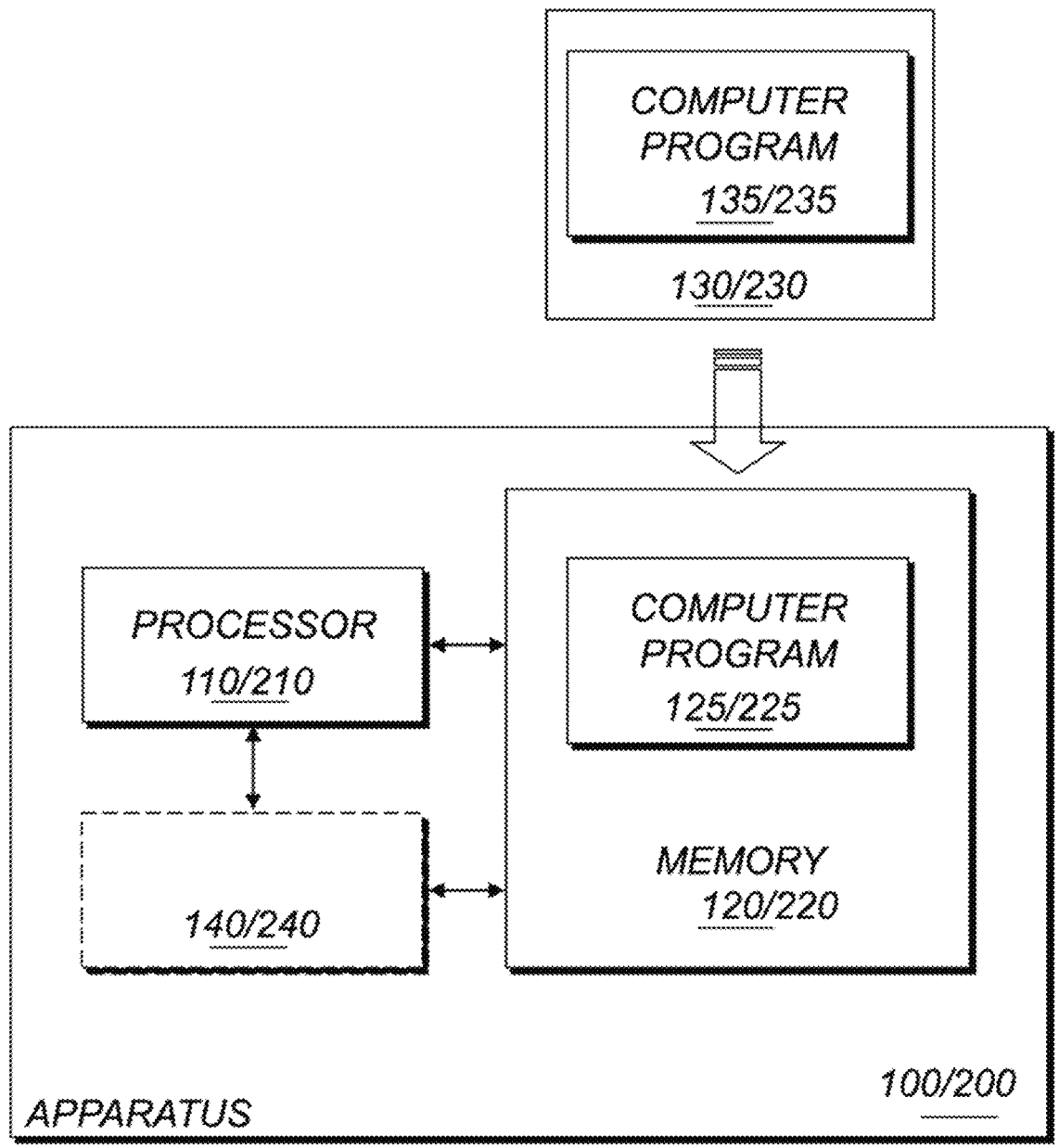
FIG. 14 is a block diagram illustrating a computer program implementation of the proposed encoding and decoding as used by a corresponding encoding and decoding apparatus according to exemplary aspects of the present advancements.
Figure 15:
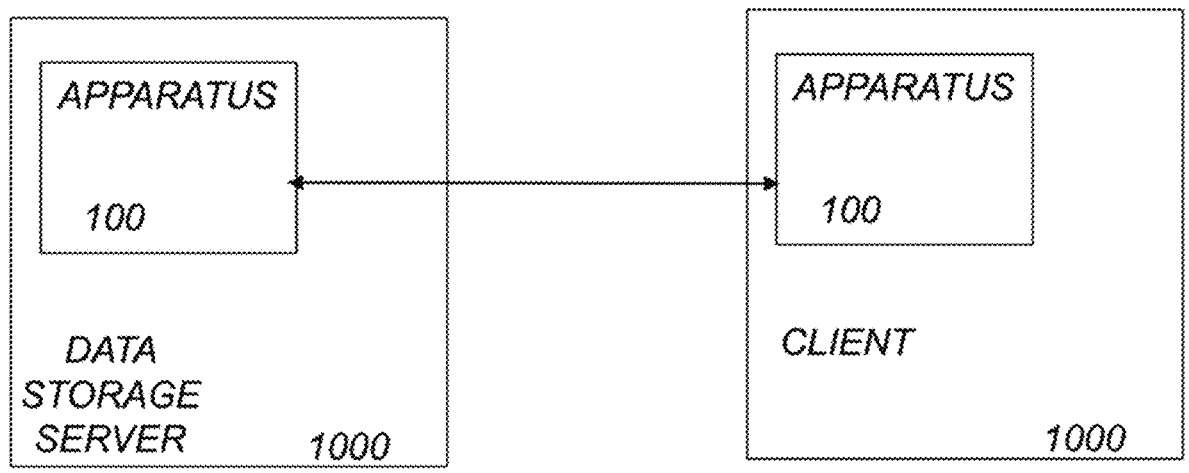
FIG. 15 is a schematic illustration of how a client accesses data from a distributed data storage provider, where the data is encoded and decoded according to exemplary aspects of the present advancements.

FIG. 14 is a schematic diagram of a computer implementation of encoding according to exemplary aspects of the present advancements. In this example, at least some of the steps, functions, procedures, modules and/or blocks described herein are implemented in a computer program 125 or 135, which is loaded into the memory 120 for execution by processing circuitry including one or more processors 110. The processor(s) 110 and memory 120 are interconnected to each other to enable normal software execution. An input/output device 140 may also be interconnected to the processor(s) 110 and/or the memory 120 to enable input and/or output of relevant data such as input parameter(s) and/or resulting output parameter(s). The term 'processor' includes any system or device capable of executing program code or computer program instructions to perform a particular processing, determining or computing task. The processing circuitry including one or more processors 110 is thus configured to perform, when executing the computer program 125 or 135, well-defined processing tasks such as those described herein. The processing circuitry does not have to be dedicated to only execute the above-described steps, functions, procedure and/or blocks, but may also execute other tasks.

For example, computer program 125 or 135 may a processor to at least:
  read data in the form of a data block formatted according to specified settings to comprise rows and columns;
  create, by applying an encoding transform on the obtained data block, a set of projections, proj ($p_i$, $q_i$), the set comprising a first number of projections, proj ($p_i=1$, $q_i=0$), and a second number of projections, proj ($p_i$, $q_i\neq 0$), the second number of projections proj ($p_i$, $q_i\neq 0$) being created by applying an encoding Mojette transform on the data block;
  output(S3) the created Mojette projections to enable a storage of the data in the form of the Mojette projections.

By way of example, the software or computer program 125 or 135 may be stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

FIG. 14 is a schematic diagram illustrating an example of a computer implementation of decoding according to exemplary aspects of the present advancements. In this particular example, at least some of the steps, functions, procedures, modules and/or blocks described herein are implemented in a computer program 225 or 235, which is loaded into the memory 220 for execution by processing circuitry including one or more processors 210. The processor(s) 210 and memory 220 are interconnected to each other to enable normal software execution. An input/output device 240 may also be interconnected to the processor(s) 210 and/or the memory 220 to enable input and/or output of relevant data such as input parameter(s) and/or resulting output parameter(s). The term 'processor' includes a general sense as any system or device capable of executing program code or computer program instructions to perform a particular processing, determining or computing task. The processing circuitry including one or more processors 210 is thus configured to perform, when executing the computer program 225 or 235, well-defined processing tasks such as those described herein. The processing circuitry does not have to be dedicated to only execute the above-described steps, functions, procedure and/or blocks, but may also execute other tasks.

For example, the computer program 225 or 235 may cause a processor to at least:
  read settings, the settings comprising a number k of data fragments and a number m of parity fragments, the settings further comprises the block size, packet size, of the encoded data;
  read encoded data, the encoded data being encoded by applying an encoding Mojette transform on a data block formatted according to the settings, the encoded data comprises a set of projections, proj ($p_i$, $q_i$), the set comprising a first number of projections, proj ($p_i=1$, $q_i=0$), and a second number of projections, proj($p_i$, $q_i\neq 0$);
  check whether the first number of projections, proj ($p_i=1$, $q_i=0$), is equal to the number k of data fragments;
  select, based on the check, a decoding mode to use for decoding the data, the decoding mode being either a no-erasure decoding mode or an erasure decoding mode; and
  decode the data utilizing the selected decoding mode in order to recreate the data block.

The software or computer program 225 or 235 may be stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method of decoding encoded data, comprising:
reading, by circuitry and from a memory, settings for determining how to decode the encoded data, the settings including at least a number of data fragments and a number of parity fragments needed for decoding of the data;
reading, by the circuitry, the encoded data;
determining, by the circuitry, whether a number of projections in a first set of projections of the encoded data is equal to the number of data fragments indicated in the settings;
selecting, by the circuitry, one of a first decoding mode and a second decoding mode to decode the encoded data based on whether the number of projections in the first set of projections equals the number of data fragments indicated in the settings;
decoding, by the circuitry, the encoded data with the selected one of the first and second decoding modes; and
outputting, by the circuitry, data generated by decoding the encoded data.

2. The method of claim 1, wherein when the number of data fragments indicated by the settings equals the number of projections in the first set of projections, the encoded data is decoded according to the first decoding mode using the first set of projections.

3. The method of claim 1, wherein when the number of data fragments indicated by the settings does not equal the number of projections in the first set of projections, the encoded data is decoded according to the second decoding mode using the first set of projections and at least some projections from a set of second projections included in the encoded data.

4. The method of claim 3, wherein in the second decoding mode, multiple pixels are solved per decoding iteration using the second set of projections based on an aligned parity projection package stored with the encoded data.

5. The method of claim 1, wherein decoding of the encoded data includes a preamble decoding phase in which each iteration does not produce a correctly decoded result and a stable decoding phase in which each iteration produces a correctly decoded result.

6. The method of claim 1, further comprising parity checking the encoded data prior to decoding to detect data corruption.

7. The method of claim 1, wherein the circuitry includes a plurality of processors distributed in a network, each processor executing an erasure code aware application in order to perform at least a portion of the decoding.

8. The method of claim 1, wherein the decoding is performed by the processor using vectorized code.

9. The method of claim 1, wherein the decoding includes using single instruction multiple data (SIMD) extensions to accelerate decoding of the encoded data.

10. A non-transitory computer-readable medium storing computer-readable instructions that, when executed by a processor, cause the processor to perform a method according to claim 1.

* * * * *